United States Patent
Oishi et al.

(10) Patent No.: US 6,567,478 B2
(45) Date of Patent: May 20, 2003

(54) RADIO APPARATUS HAVING DISTORTION COMPENSATING FUNCTION

(75) Inventors: Yasuyuki Oishi, Kawasaki (JP); Takeshi Takano, Kawasaki (JP); Kazuo Nagatani, Kawasaki (JP); Tokuro Kubo, Kawasaki (JP); Takayoshi Ode, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/037,809

(22) Filed: Nov. 7, 2001

(65) Prior Publication Data

US 2002/0085647 A1 Jul. 4, 2002

Related U.S. Application Data

(63) Continuation of application No. PCT/JP99/04036, filed on Jul. 28, 1999.

(51) Int. Cl.[7] .............................................. H04L 25/49
(52) U.S. Cl. ...................................... 375/297; 332/162
(58) Field of Search ................................. 375/295, 296, 375/297, 285; 455/63; 330/75; 332/159, 160, 161, 162

(56) References Cited

U.S. PATENT DOCUMENTS

| | | | |
|---|---|---|---|
| 4,700,151 A | 10/1987 | Nagata | |
| 5,903,611 A | 5/1999 | Schnabl et al. | |
| 5,903,823 A * | 5/1999 | Moriyama et al. | 455/126 |
| 6,240,144 B1 * | 5/2001 | Ha | 375/297 |
| 6,278,743 B1 * | 8/2001 | Templin | 375/296 |

FOREIGN PATENT DOCUMENTS

| | | |
|---|---|---|
| JP | 53116021 | 10/1978 |
| JP | 62139425 | 6/1987 |
| JP | 63121326 | 5/1988 |
| JP | 08051320 | 2/1996 |
| JP | 09116474 | 5/1997 |
| JP | 10145146 | 5/1998 |
| JP | 1013604865 | 5/1998 |
| JP | 10150394 | 6/1998 |
| JP | 10200587 | 7/1998 |

OTHER PUBLICATIONS

Nagatani, et al. Simulated Tolerance of Loop Parameters of Cartesian Feedback Amplifier for #/4–Shifted QPSK Transmitter Fujitsu Laboratories Ltd. pp. 25–30 Jun. 26, 1992.

Kim, et al. Compensation of Nonlinear Distortion Using a Predistorter Based on the Fixed Point Approach in OFDM Systems LG Information & Communications, Ltd. pp. 2145–2149 1998.

* cited by examiner

*Primary Examiner*—Tesfaldet Bocure
(74) *Attorney, Agent, or Firm*—Katten Muchin Zavis Rosenman

(57) ABSTRACT

In a radio apparatus which compensates for non-linear distortion of a transmission power amplifier, a distributor feeds back the output signal of the transmission power amplifier, an error-signal estimating arithmetic unit digitally estimates an error signal, which is ascribable to non-linear distortion of the power amplifier, using a transmit signal and feedback signal, the transmit signal and the error signal are DA-converted by separate DA converters, and a combiner combines the output signals of the DA converters and inputs the combined signal to the transmission power amplifier to perform distortion compensation.

21 Claims, 27 Drawing Sheets

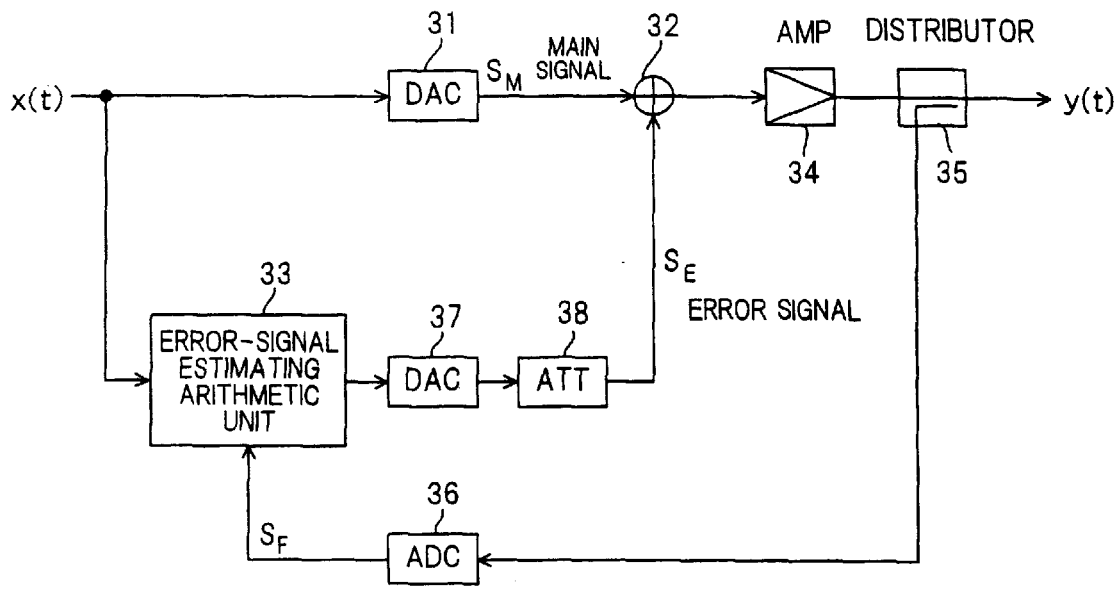
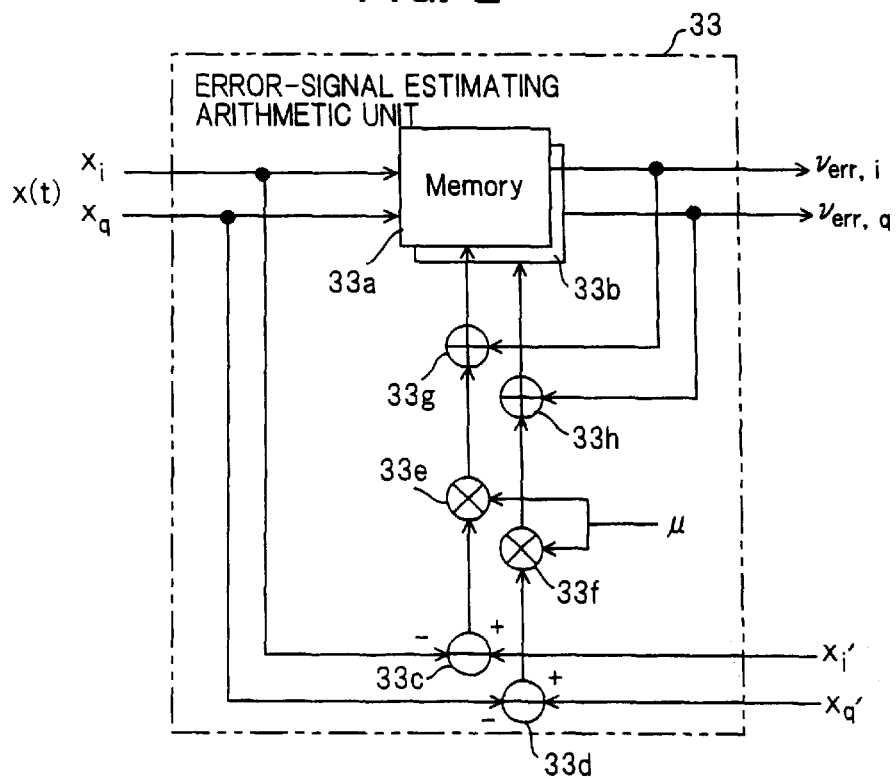

PRIOR ART

RADIO APPARATUS HAVING DISTORTION COMPENSATING FUNCTION

This application is a continuation division of international application number PCT 99/04036, filed Jul. 28, 1999.

TECHNICAL FIELD

This invention relates to a radio apparatus having a function which compensates for non-linear distortion of a transmission power amplifier.

A power amplifier for amplifying a linear modulated signal used in wireless communications is required to have an amplifier with excellent linearity in order to suppress deterioration of transmission characteristics caused by spectrum characteristics and signal distortion. On the other hand, it is required in almost all applications that an amplifier deliver a high power efficiently at all times. In general, linearity and efficiency of an amplifier are characteristics that run counter to each other and a variety of distortion compensation schemes have been proposed in order to reconcile the two.

The field of next-generation mobile telephone systems (IMT-2000, etc.) based upon W-CDMA is one in which the present invention is particularly useful. With W-CDMA, code division multiplexing is used in direct-sequence spread-spectrum modulation and multiple-access for signal modulation. The transmitted signal has a wider band and a higher dynamic range in comparison with the narrow-band modulation and time division multiplexing schemes used heretofore in existing second-generation mobile telephones (PDC), etc. Accordingly, a power amplifier used in a W-CDMA apparatus is required to exhibit better linearity and higher efficiency than in the past.

BACKGROUND ART

FIG. 29 is a block diagram illustrating an example of a radio apparatus according to the prior art. A transmit-signal generator 1 transmits a serial digital data sequence and a serial/parallel (S/P) converter 2 divides the digital data sequence alternately one bit at a time to convert the data to two sequences, namely an in-phase component signal ("I signal": In-phase component) and a quadrature component signal ("Q signal": Quadrature component). A DA converter 3 converts the I and Q signals to respective ones of analog baseband signals and inputs these to a quadrature modulator 4. The latter multiplies the input I and Q signals (the transmit baseband signals) by a reference carrier wave and a signal that has been phase-shifted relative to the reference carrier by 90°, respectively, and sums the results of multiplication to thereby perform quadrature modulation and output the modulated signal. A frequency converter 5 mixes the quadrature-modulated signal and a local oscillation signal to thereby effect a frequency conversion, and a transmission power amplifier 6 power-amplifies the carrier output from the frequency converter 5. The amplified signal is released into the atmosphere from an antenna 7.

In a transmitting apparatus of this kind, the input/output characteristic of the transmission power amplifier develops non-linearity, as indicated by the dashed line in FIG. 30(a). Owing to this non-linear characteristic, non-linear distortion occurs and the frequency spectrum in the vicinity of transmission frequency $f_0$ develops rising side lobes as indicated by the dashed lines in FIG. 30(b). This leads to leakage and interference between neighboring channels. For this reason, various distortion compensating techniques have been proposed, one of which is a predistorter (an distortion compensating device). A predistorter adds a characteristic that is the inverse of the distortion of a transmission power amplifier onto an input signal in advance, whereby the transmission power amplifier outputs the desired distortion-free signal.

FIG. 31 is a block diagram of a radio apparatus having a non-linear distortion compensating function, which uses a digital Cartesian scheme, as a prior-art example of a predistorter. Digital data sent from the transmit-signal generator 1 is converted to two signal sequences, namely an I signal $v_i$ and a Q signal $v_q$, in the S/P converter 2, and these signals enter a predistorter 8. The predistorter 8 reads distortion compensation values $\Delta v_i(n)$, $\Delta v_q(n)$, which correspond to the input baseband signals $v_i$, $v_q$, out of distortion compensation tables 8a, 8b, adds these compensation values to the signals $v_i$, $v_q$ and inputs the results to the DA converter 3. The latter converts the entered I signal $v_i$ and Q signal $v_q$ to analog baseband signals and inputs these signals to the quadrature modulator 4. The latter multiplies the input I and Q signals by a reference carrier wave and a signal that has been phase-shifted relative to the reference carrier by 90°, respectively, and sums the results of multiplication to thereby perform quadrature modulation and output the modulated signal. The frequency converter 5 mixes the quadrature-modulated signal and a local oscillation signal to thereby effect a frequency conversion, and the transmission power amplifier 6 power-amplifies the carrier output from the frequency converter 5. The amplified signal is released into the atmosphere from the antenna 7. Part of the transmit signal is input to a frequency converter 10 via a directional coupler 9, whereby the signal undergoes a frequency conversion and is input to a quadrature detector 11.

The quadrature detector 11 multiplies the input signal by a reference carrier wave and a signal that has been phase-shifted relative to the reference carrier by 90°, reproduces baseband signals $v'_i$, $v'_q$ on the transmitting side and applies these signals to an AD converter 12. The latter converts the applied I and Q signals to digital data and inputs the digital data to a distortion compensator 8. At this time a phase shifter 13 applies a phase adjustment in such a manner that the phases of the demodulated baseband signals $v_i'$, $v_q'$ will coincide with the phases of the input signals $v_i$, $v_q$. The AD demodulator 12 applies an AD conversion to the demodulated baseband signals $v_i'$, $v_q'$ obtained by quadrature detection and inputs the resulting signals to the predistorter 8. The latter compares the demodulated baseband signals $v_i'$, $v_q'$ and the input baseband signals $v_i$, $v_q$, updates the compensation values in the distortion compensation tables 8a, 8b based upon errors between the signals and stores updated distortion compensation values $\Delta v_i(n+1)$, $\Delta v_q(n+1)$ in the memories 8a, 8b. The operation described above is subsequently repeated.

With the digital Cartesian scheme described above, predistortion is carried out by obtaining distortion of the transmission power amplifier as an error along each axis of a rectangular coordinate system and adding characteristics that are the inverse of these errors to the respective axial components.

FIG. 32 is a prior-art example of distortion compensation based upon a feed-forward (FF) scheme. With the FF scheme, part of a signal that has been amplified by a main amplifier (transmission power amplifier) 6 is branched by a directional coupler 9, and an arithmetic unit 15 calculates the difference between the branched part of the signal and a signal obtained by subjecting the input signal to a delay adjustment and level adjustment. The difference signal is a non-linear distortion component produced by the main amplifier 6. The difference signal is amplified by a linear auxiliary amplifier 16, and a combiner 18 combines, 180° out of phase, the output of the auxiliary amplifier and a signal that is result of delaying the main amplifier output by a delay line 17. As a result, distortion compensation is achieved by canceling out the distortion components.

Problems of the Prior Art

With the conventional predistorter, the signal that has undergone predistortion is required to have a wide dynamic range in comparison with the dynamic range of the original signal in order to compensate for amplitude distortion of the amplifier (the power transmission amplifier). This means that a higher bit precision is required for the DA converter that subjects the predistortion signal to a DA conversion. In the case of a power amplifier used in W-CDMA in particular, the original signal is a code-multiplexed signal whose amplitude exhibits a large fluctuation and, moreover, is a wideband signal owing to direct-sequence spread-spectrum modulation. With the conventional predistortion scheme, therefore, the DA converter requires a high bit precision and, at the same time, a high conversion speed. If such requirements are not met, a problem that results is deterioration of the distortion compensation characteristic.

Further, in predistortion of a power amplifier used in multicarrier W-CDMA, in which multiple carriers undergo common amplification, the DA converter is required to have even higher speed and higher bit precision capabilities. When application to W-CDMA devices currently developed is considered, a problem encountered is that the performance of currently existing DA converters cannot satisfy the requirements of high speed and high bit precision.

The aforesaid problems arise not only with regard to DA converters but hold true also for AD converters that sample a feedback signal for the purpose of updating distortion compensation coefficients.

Further, in a radio apparatus having a predistorter that compensates for amplifier distortion as a function of input power, the quadrature modulator and quadrature demodulator are implemented by analog circuits. A problem encountered is that amplifier-distortion estimation error grows owing to imperfections with these quadrature modulator/demodulators and a satisfactory distortion compensation characteristic is not obtained.

With the FF scheme, a problem that arises is that efficiency of the overall distortion compensating device declines because it is necessary to use a low-efficiency auxiliary amplifier that requires a high degree of linearity and because the delay lines and coupler are lossy.

Accordingly, an object of the present invention is to provide a radio apparatus that makes it possible to compensate for distortion of a transmission power amplifier by predistortion even though a DA converter and an AD converter are not required to have high speed and a high bit precision.

Another object of the present invention is to provide a radio apparatus using a digital quadrature modulator and digital quadrature demodulator to eliminate the imperfections of analog quadrature modulator/demodulators, whereby a satisfactory distortion compensation characteristic is obtained.

Another object of the present invention is to provide a radio apparatus having a highly efficient distortion compensation device without use of an auxiliary amplifier or delay lines.

DISCLOSURE OF THE INVENTION

In a radio apparatus according to the present invention, a transmit signal (main signal) and a distortion component (error signal) added onto the main signal are each subjected to a DA conversion independently, after which the converted signals are combined and input to a transmission power amplifier. If this arrangement is adopted, the amplitude of the error signal will be small with respect to the amplitude of a predistortion signal obtained by adding a characteristic that is the inverse of amplitude distortion to the main signal. As a result, it is possible to lower the bit precision of a DA converter, which outputs only the error signal. Further, a DA converter that outputs only the main signal need not have a wide dynamic range and the bit precision of this DA converter an be lowered as well.

Further, in a case where compensation is applied to non-linear distortion of a transmission power amplifier that amplifies and transmits a multicarrier signal carrying a plurality of transmit signals, a signal obtained by DA-converting an error signal is combined with a frequency-multiplexed signal obtained by subjecting DA-converted signals of respective ones of transmit signals to a frequency-shift operation decided by carrier spacing and multiplexing the frequency-shifted signals, and the combined signal is input to the transmission power amplifier. If this arrangement is adopted, each of the transmit signals and the error signal are DA-converted independently and combined. As a result, neither of the DA converters need have a wide dynamic range and, hence, bit precision can be suppressed.

In a radio apparatus according to the present invention, predistortion processing, in which distortion compensation coefficients are read out of a distortion compensation coefficient table and a transmit signal is subjected to distortion compensation using the distortion compensation coefficients, and coefficient update processing, in which the distortion compensation coefficient table is updated using a feedback value (amplifier output signal) that has been sampled by an AD converter, are executed separately in terms of time. By thus executing the updating of distortion compensation coefficients and predistortion processing separately in terms of time, a real-time feedback loop is not formed. As a result, sampled values that are continuous in time are not required as values sampled by the AD converter, thus making it possible to mitigate the requirement that the AD converter have a high speed. Further, since distortion compensation is performed by predistortion processing, there is no need for an auxiliary amplifier and delay lines, which were an impediment to an improvement in efficiency with the FF scheme. This makes it possible to raise the overall efficiency the transmission power amplifier that undergoes distortion compensation.

Further, in a radio apparatus according to the present invention, a wide-band sample-and-hold circuit is provided on the input side of an AD converter that samples a feedback value. If such a wide-band sample-and-hold circuit is connected to the input of an AD converter and a wide-band signal whose spectrum has spread owing to non-linear distortion is sampled by this circuit, then it will be possible to perform an AD conversion at a sampling rate lower than the Nyquist rate. In other words, though it is necessary that a sampled band be widened enough (beyond the Nyquist rate) to enable observation of the distorted signal, the sampling rate (the number of samples per unit time) can be set independently of the Nyquist rate and the requirement that the AD converter have a high speed can be mitigated.

In a radio apparatus according to the present invention, a quadrature modulator and a quadrature demodulator are implemented by digital operations. Adopting a digital quadrature modulator/demodulator makes it possible to reduce the error of the quadrature modulator/demodulator to less than 1 LSB of DA and AD converters. This makes it possible to eliminate deterioration of distortion compensation characteristics caused by imperfections in a quadrature modulator/demodulator.

BRIEF DESCRIPTION OF THE DRAWINGS

FIG. 1 shows a radio apparatus according to a first embodiment of the present invention;

FIG. 2 shows an embodiment of an error-signal estimating arithmetic unit (Cartesian scheme);

BEST MODE FOR CARRYING OUT THE INVENTION

(A) First Embodiment

Figure 3:
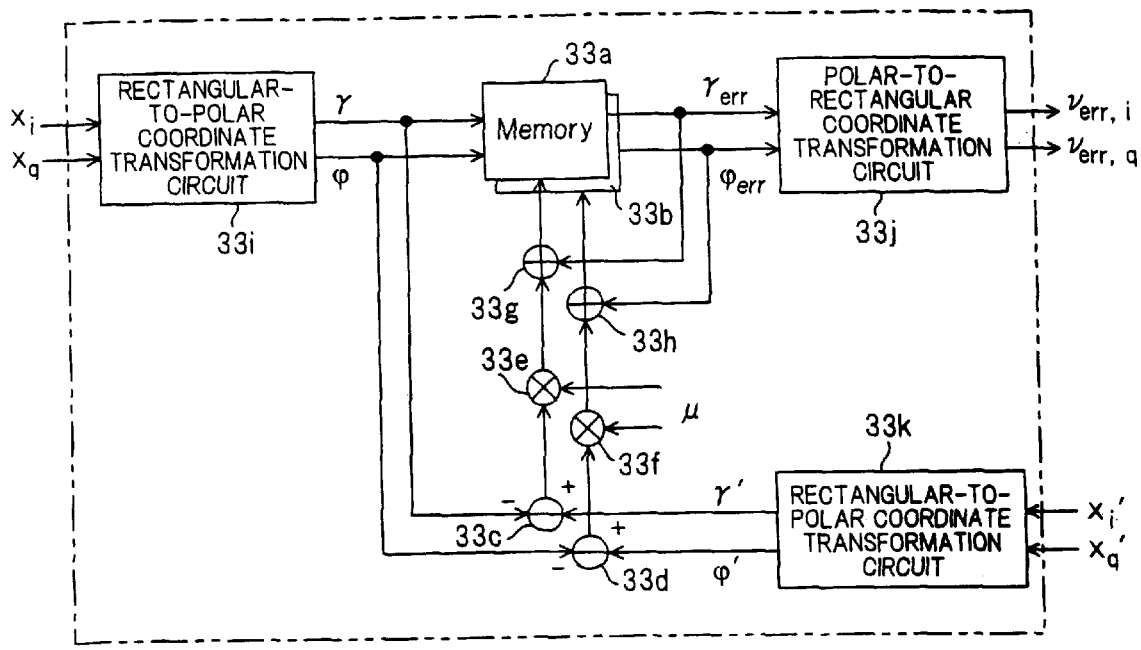
FIG. 3 shows an embodiment of an error-signal estimating arithmetic unit (polar-loop scheme)

FIG. 1 is a diagram showing the structure of a first embodiment of the present invention. A digital transmit signal x(t) output from a transmit-signal generator (not shown) is converted to an analog signal (main signal $S_M$) by a DA converter 31, and a combiner 32 combines this signal with an error signal $S_E$, which is output from an error-signal estimating arithmetic unit 33, and inputs the combined signal to a power amplifier (amp) 34. Part of the amplifier output is branched by a distributor 35 such as a directional coupler and is then sampled by an AD converter 36, thus becoming a feedback signal $S_F$. The error-signal estimating arithmetic unit 33 uses the transmit signal x(t) and the feedback signal $S_F$ to calculate an error ascribable to non-linear distortion of the amplifier. A DA converter 37 subjects the obtained error signal to a DA conversion, an attenuator 38 adjusts the level of the error signal and then the combiner 32 combines the main signal $S_M$ and the error signal $S_E$ and inputs the combined signal to the amplifier. It should be noted that it is also possible to adopt an arrangement in which the combined signal output from the combiner 32 is input to the amplifier 34 after bring frequency-converted to an RF signal (IF→RF) and the amplifier output signal from the distributor 35 is input to the AD converter 36 after being frequency-converted to an IF signal (RF→IF).

Thus, the amplifier input signal is a signal obtained by adding on a characteristic that is the inverse of the non-linear distortion of the amplifier (a signal that has been subjected to predistortion), and therefore a linear amplified output signal is obtained at the amplifier output.

FIG. 2 shows a first embodiment of the error-signal estimating arithmetic unit. This is an example using a predistorter based upon a digital Cartesian scheme. The error-signal estimating arithmetic unit 33 calculates error signals ($v_{err,i}$, $v_{err,q}$) as equivalent baseband signals (complex numbers) using a rectangular coordinate system. Error signals conforming to the respective components of a transmit baseband signal ($x_i$,$x_q$) have been stored in memory tables 33a, 33b, respectively.

When the transmit signal x(t) is generated, the error signals ($v_{err,i}$, $v_{err,q}$) conforming to the transmit baseband signals ($x_i$,$x_q$) are read out of the memory tables 33a, 33b and undergo vector addition with the transmit signals ($x_i$,$x_q$) in the combiner 32 (FIG. 1), whereby predistortion is performed. Arithmetic units 33c, 33d calculate difference vectors ($x_i'-x_i$,$x_q'-x_q$) between the transmit baseband signals ($x_i$,$x_q$) and feedback signals ($x_i'$,$x_q'$), multipliers 33e, 33f multiply the difference vectors by a step-size parameter $\mu$ (0<$\mu$<1), and adders 33g, 33h add the multiplier outputs to the error signals ($v_{err,i}$, $v_{err,q}$) and store the results of addition at memory addresses corresponding to the axial components of the transmit baseband signals ($x_i$,$x_q$), thereby achieving updating.

FIG. 3 is a second embodiment of the error-signal estimating arithmetic unit. This is an example using a predistorter based upon a polar-loop scheme. The error-signal estimating arithmetic unit 33 calculates the error signals ($v_{err,i}$, $v_{err,q}$) in an equivalent baseband system using a polar coordinate system. Error signals ($r_{err}$,$\phi_{err}$) conforming to (r,$\phi$), which are the result of subjecting the transmit baseband signals ($x_i$,$x_q$) to a polar transformation, have been stored in memory tables 33a, 33b, respectively.

If the transmit baseband signals ($x_i$,$x_q$) are input, a rectangular-to-polar coordinate transformation circuit 33i transforms the transmit baseband signals to polar coordinates ($\gamma$,$\phi$) and reads error signals ($r_{err}$,$\phi_{err}$), which conform to the transmit signals (r,$\phi$), out of the memory tables 33a, 33b. A polar-to-rectangular coordinate transformation circuit 33j transforms the error signals ($r_{err}$,$\phi_{err}$) to the error signals ($v_{err,i}$, $v_{err,q}$) in the rectangular coordinate system, and the combiner 32 (FIG. 1) performs predistortion by performing vector addition between the error signals ($v_{err,i}$, $v_{err,q}$) and the transmit baseband signals ($x_i$,$x_q$).

A rectangular-to-polar coordinate transformation circuit 33k transforms the feedback signals ($x_i'$,$x_q'$) to polar coordinates ($\gamma'$,$\phi'$). The arithmetic units 33c, 33d calculate difference vectors (r'-r,$\phi'$-$\phi$) between the transmit baseband signals (r,$\phi$) and feedback signals (r',$\phi'$), the multipliers 33e, 33f multiply the difference vectors by a step-size parameter $\mu$ (0<$\mu$<1), and the adders 33g, 33h add the multiplier outputs to the error signals ($r_{err}$,$\phi_{err}$) and store the results of addition at memory addresses corresponding to the components of the transmit signals (r,$\phi$), thereby achieving updating.

Figure 4:
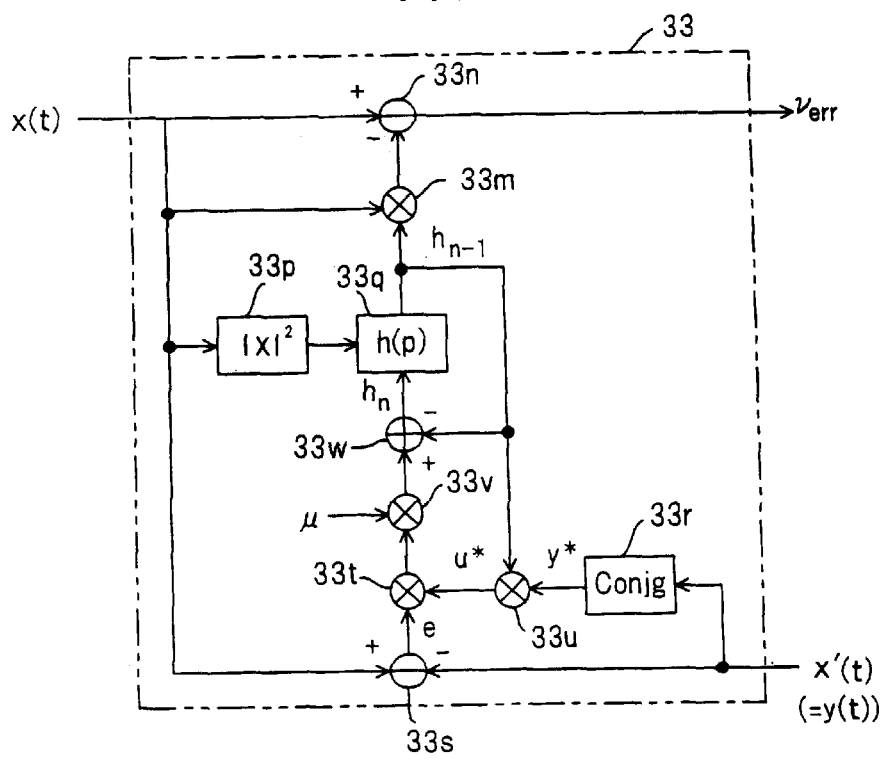
FIG. 4 shows an embodiment of an error-signal estimating arithmetic unit (scheme based upon an LMS algorithm)

FIG. 4 is a third embodiment of the error-signal estimating arithmetic unit. This is an example using an adaptive predistorter. An adaptive predistorter is a scheme for performing predistortion by estimating amplifier distortion using an LMS adaptive algorithm and adding a characteristic that is the inverse of this distortion to a transmit signal by complex multiplication.

The error-signal estimating arithmetic unit 33 has a multiplier 33m for multiplying the transmit signal x(t) by a distortion compensation coefficient $h_{n-1}$(p), and an arithmetic unit 33n for subtracting $h_{n-1}$*x(t) from the transmit signal x(t) and outputting an error signal $v_{err}$ [=$h_n$(p)x(t)-x(t)]. An arithmetic unit 33p calculates power p [=x(t)$^2$] of the transmit signal x(t), and a distortion compensation coefficient storage unit 33q stores a distortion compensation coefficient h(p) that conforms to each power of the transmit signal x(t) and outputs a distortion compensation coefficient $h_{n-1}$(p) conforming to the power p of the transmit signal x(t). Further, the distortion compensation coefficient storage unit 33q updates the distortion compensation coefficient $h_{n-1}$(p) by a distortion compensation coefficient $h_n$(p) decided by the LMS algorithm.

Reference characters 33r represent a complex-conjugate signal output unit, 33s a subtractor for outputting a difference e(t) between the transmit signal x(t) and a feedback demodulation signal y(t), 33t a multiplier for multiplying e(t) and u*(t), 33u a multiplier for multiplying $h_{(n-1)}$(p) and y*(t) and outputting u*(t), 33v a multiplier for multiplying by a step-size parameter, and 33w an adder for adding $h_{(n-1)}$(p) and $\mu$e(t)u*(t). An operation in accordance with the following LMS algorithm is performed by the arrangement set forth above: The arithmetic operations performed by the arrangement set forth above are as follows:

$$h_n(p)=h_{n-1}(p)+\mu e(t)u^*(t) \quad (1)$$

$$e(t)=x(t)-y(t)$$

$$y(t)=h_{n-1}(p)x(t)f(p)$$

$$u(t)=x(t)f(p)\approx h^*_{n-1}(p)y(t)h_{n-1}(p)h^*_{n-1}(p)\approx 1$$

$$p=|x(t)|^2$$

where
x(t): input baseband signal (transmit signal)
f(p): amplifier distortion function
h(p): estimated distortion compensation coefficient
$\mu$: step-size parameter
y(t): feedback signal
u(t): distorted signal Here x, y, f, h, u, e represent complex numbers and signifies a complex conjugate. The signal u(t) approximates [($h_{n-1}$(p)·h*$_{n-1}$(p)≈1] if it is assumed that amplitude distortion of the amplifier is not very large.

By executing the processing set forth above, the distortion compensation coefficient h(p) is updated in accordance with Equation (1) so as to minimize the difference e(t) between the transmit signal x(t) and the feedback signal y(t), and the coefficient eventually converges to the optimum distortion compensation coefficient so that compensation is made for the distortion in the transmission power amplifier.

Figure 5:
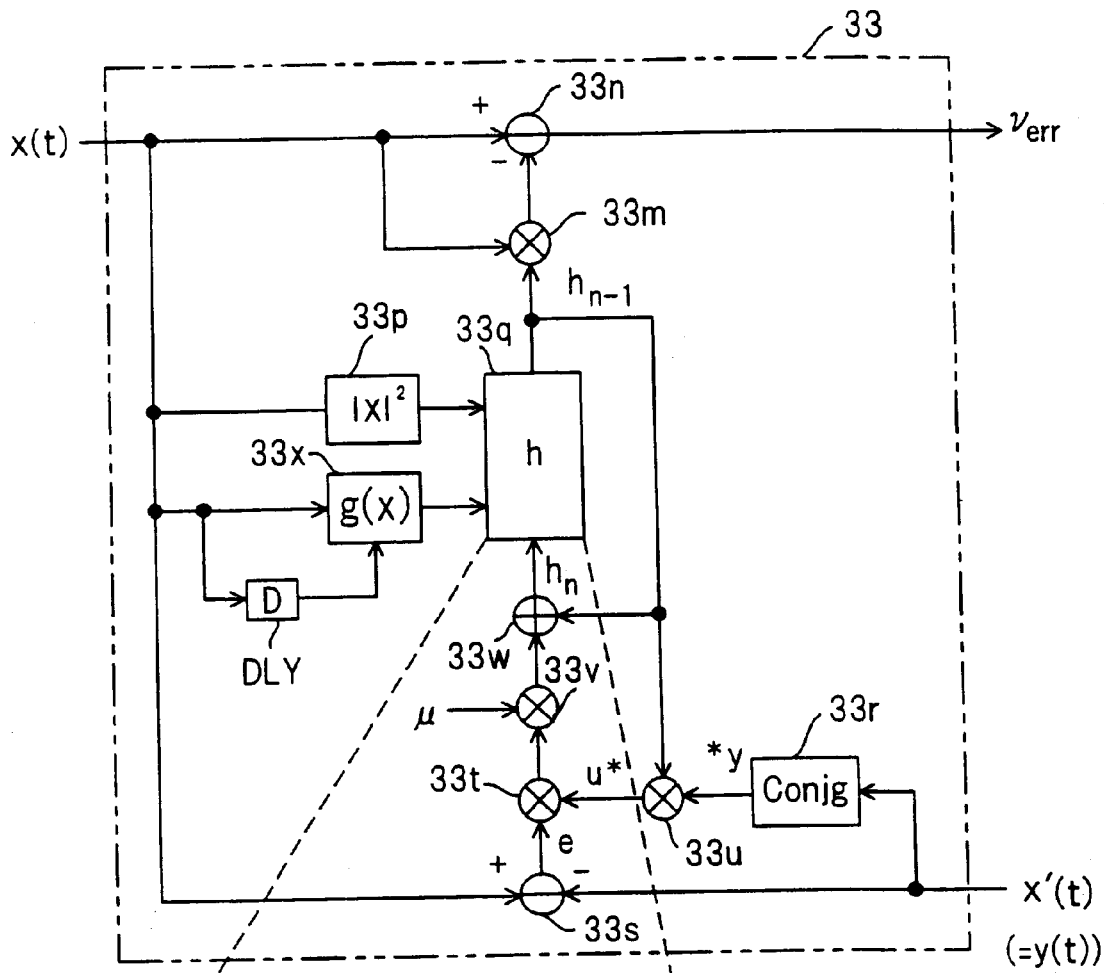
FIG. 5 shows an embodiment of an error-signal estimating arithmetic unit (example in which a past transmit signal value is taken into account)

FIG. 5 is a fourth embodiment of the error-signal estimating arithmetic unit. This is an example using an adaptive predistorter, in which components identical with those of the embodiment of FIG. 4 are designated by like reference characters. This embodiment differs in that (1) distortion compensation coefficients are stored and updated in the distortion compensation coefficient storage unit 33q in correspondence with combinations of present momentary power P=$|x(t)|^2$ and a function g(x) of present and past inputs, and (2) an arithmetic unit 33x for calculating the function g(x) is provided. FIG. 5 illustrates an example in which a difference $\Delta$p between present power and previous power is taken as the function g(x) [$\Delta$p=$|x(t)|^2$-$|x(t-1)|^2$].

The predistorter of FIG. 5 treats the amplifier as a distortion transmission path having a memory in order to compensate for frequency asymmetric distortion of the amplifier and performs predistortion by estimating this distortion using the LMS adaptive algorithm and adding a characteristic that is the inverse of this distortion to a transmit signal by complex multiplication. In order to compensate for distortion that has been influenced by past input amplitude, distortion compensation coefficients are stored and updated as a table regarding the two dimensions of present momentary power $P=|x(t)|^2$ and the function $g(x)$ $(=\Delta p)$ of present and past inputs.

The error signal $v_{err}(t)=h*x(t)-x(t)$ is obtained by subtracting the transmit signal $x(t)$ from the transmit signal $h_{n-1}\cdot x(t)$, which has undergone distortion compensation, using the adapting predistorter of this embodiment.

(B) Second Embodiment

Figure 6:
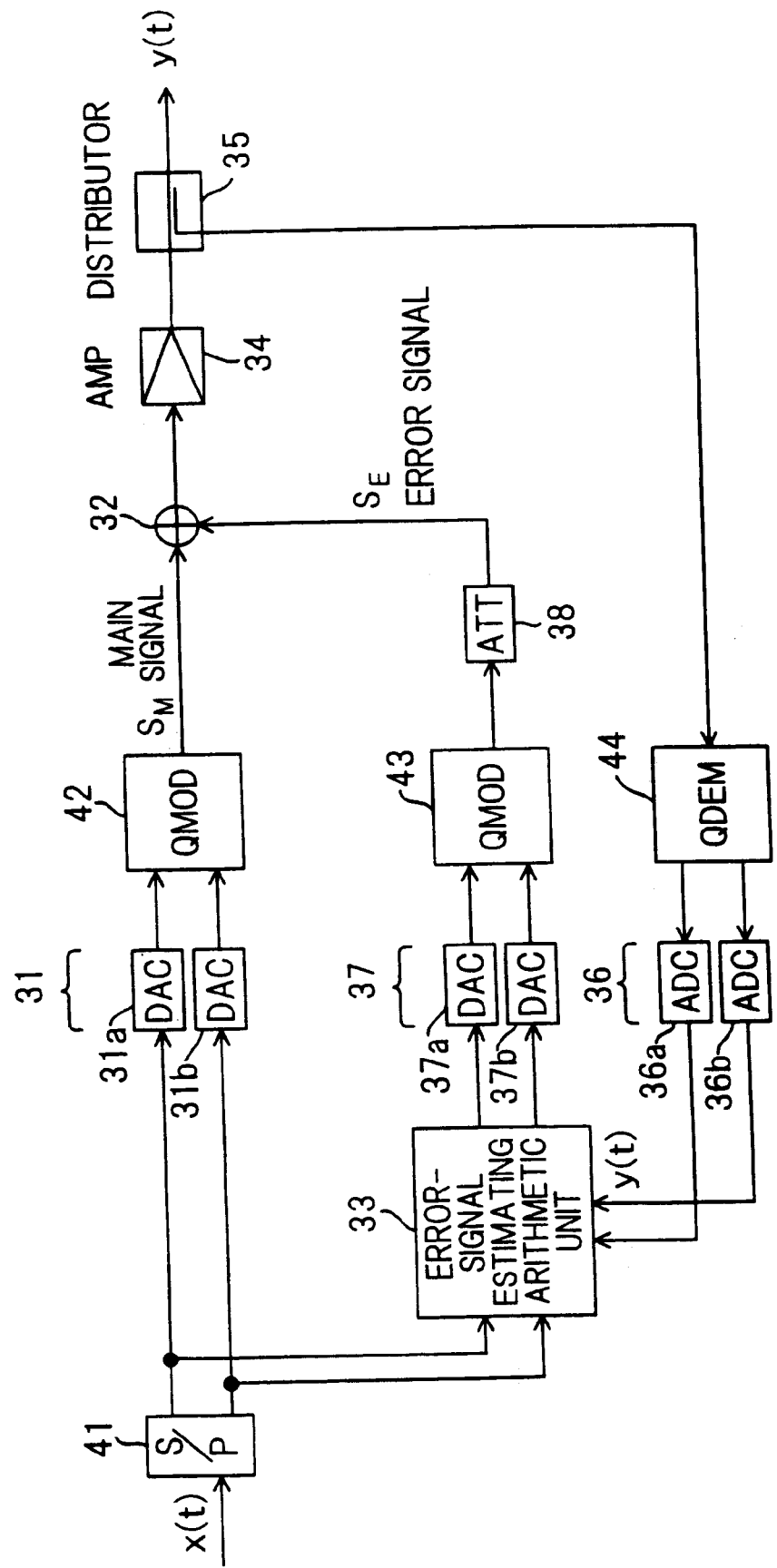
FIG. 6 shows a second embodiment for a case where a transmit signal is processed upon being converted to quadrature signals (use of analog quadrature modulator/demodulator)

FIG. 6 shows a second embodiment for a case where the transmit signal $x(t)$ is processed upon being converted to quadrature signals. Components identical with those of the first embodiment of FIG. 1 are designated by like reference characters. The second embodiment differs from the first embodiment in that the transmit signal, error signal and feedback signal are calculated in an equivalent baseband system (complex coordinate system). To achieve this, an S/P converter 41 for dividing the transmit signal $x(t)$ alternately one bit at a time to convert the signal to quadrature signals (I and Q signals), quadrature modulators 42, 43 and a quadrature demodulator 44 are provided. Further, DA converters 31a, 31b are provided as the DA converter 31 for DA-converting the components of the quadrature signals, DA converters 37a, 37b are provided as the DA converter 37 for DA-converting the components of the error signal, and AD converters 36a, 36b are provided as the AD converter 36 for AD-converting the in-phase and quadrature components of the feedback signal.

The S/P converter 41 converts the transmit signal $x(t)$ to quadrature signals and the DA converters 31a, 31b convert the quadrature-signal components to analog signals and input the analog signals to the quadrature modulator 42. The latter generates the main signal $S_M$ by applying quadrature modulation to the in-phase component and quadrature component (I and Q signals) input from the DA converters 31a, 31b. The combiner 32 combines the main signal $S_M$ with the error signal $S_E$, which is output from the error-signal estimating arithmetic unit 33, and inputs the combined signal to the power amplifier (amp) 34. Part of the amplifier output is branched by the distributor 35, such as the directional coupler, and enters the quadrature demodulator 44. The latter reconstructs the baseband signals on the transmit side by applying quadrature demodulation to the input signal and inputs the I, Q signals to the AD converters 36a, 36b. These AD converters subject the I, Q signals to an AD conversion and input the results to the error-signal estimating arithmetic unit 33 as the feedback signal $y(t)$.

The error-signal estimating arithmetic unit 33 uses the transmit signal $x(t)$ and the feedback signal $y(t)$ to calculate an error signal ascribable to non-linear distortion of the amplifier. The DA converters 37a, 37b subject the in-phase component and quadrature component, respectively, of the obtained error signal to a DA conversion and input the results to the quadrature modulator 43. The latter generates the error signal $S_E$ by applying quadrature modulation to the in-phase component and quadrature component (I and Q signals) that enter from the DA converters 37a, 27b. The attenuator 38 adjusts the level of the error signal and then the combiner 32 combines the main signal $S_M$ and the error signal $S_E$ and inputs the combined signal to the amplifier.

It should be noted that it is also possible to adopt an arrangement in which the combined signal output from the combiner 32 is input to the amplifier 34 after bring frequency-converted to an RF signal (IF→RF) and the amplifier output signal from the distributor 35 is input to the AD converter 36 after being frequency-converted to an IF signal (RF→IF).

Thus, the amplifier input signal is a signal obtained by adding on a characteristic that is the inverse of the non-linear distortion of the amplifier (a signal that has been subjected to predistortion), and therefore a linear amplified output signal is obtained at the amplifier output.

(C) Third Embodiment

Figure 7:
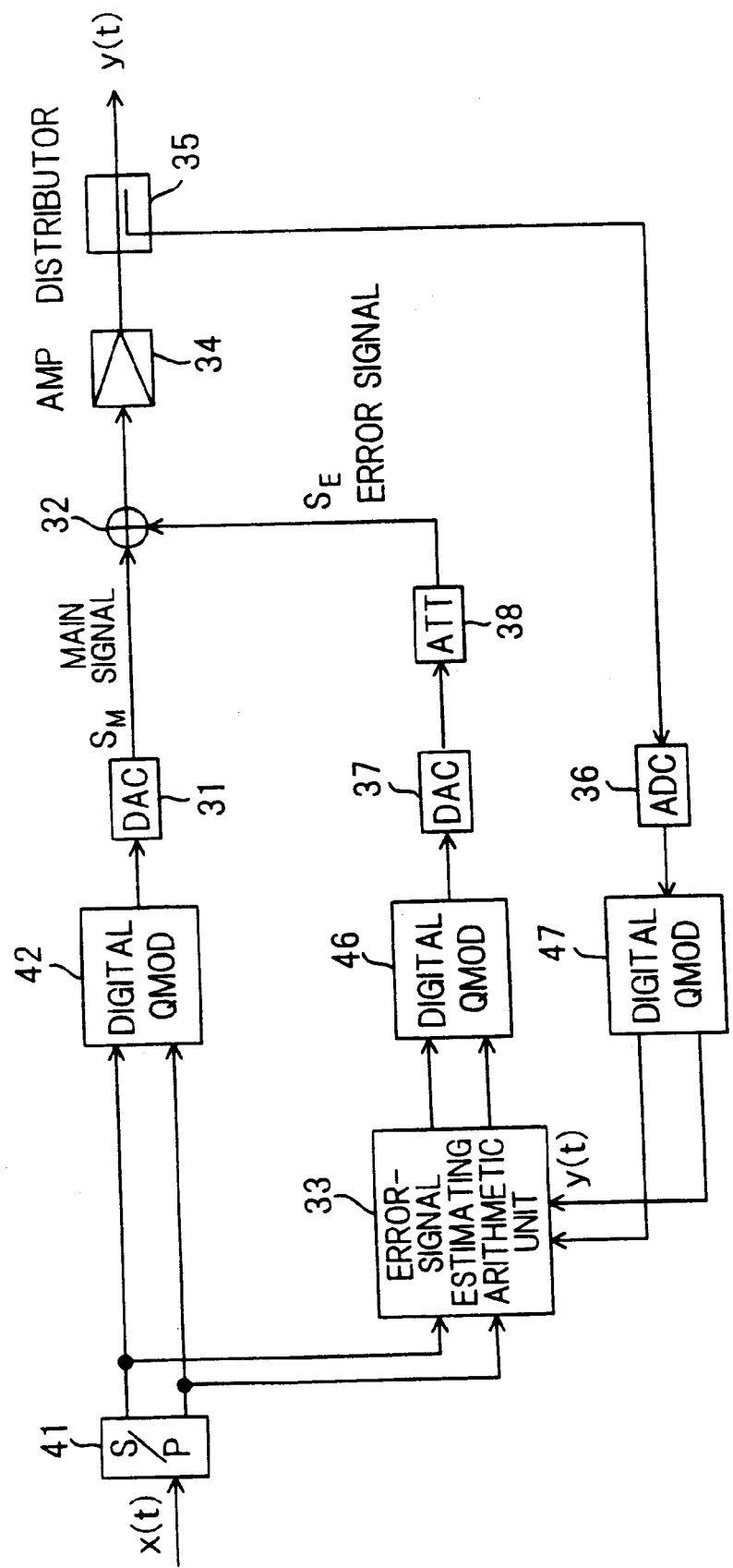
FIG. 7 shows a third embodiment for a case where a transmit signal is processed upon being converted to quadrature signals (use of digital quadrature modulator/demodulator)

FIG. 7 shows a third embodiment for a case where the transmit signal is processed upon being converted to quadrature signals. Components identical with those of the first embodiment of FIG. 1 are designated by like reference characters. The third embodiment differs from the first embodiment in that the transmit signal, error signal and feedback signal are calculated in an equivalent baseband system (complex coordinate system), and in that there are provided the S/P converter 41 for dividing the transmit signal $x(t)$ alternately one bit at a time to convert the signal to quadrature signals (I and Q signals), digital quadrature modulators 45, 46 and a digital quadrature demodulator 47.

The S/P converter 41 converts the transmit signal $x(t)$ to quadrature signals, the digital quadrature modulator 45 applies quadrature modulation to the in-phase component and quadrature component (I and Q signals) input from the S/P converter, and the DA converter 31 generates the main signal $S_M$ by converting the digital quadrature-modulated signal to an analog signal. The combiner 32 combines the main signal $S_M$ with the error signal $S_E$ output from the error-signal estimating arithmetic unit 33 and inputs the combined signal to the power amplifier (amp) 34. Part of the amplifier output is branched by the distributor 35, such as the directional coupler, and enters the digital quadrature demodulator 47. The latter reconstructs the baseband signals on the transmit side by applying quadrature demodulation to the input signal and inputs the in-phase component and quadrature component to the error-signal estimating arithmetic unit 33 as the feedback signal $y(t)$.

The error-signal estimating arithmetic unit 33 uses the transmit signal $x(t)$ and the feedback signal $y(t)$ to calculate an error signal ascribable to non-linear distortion of the amplifier. The digital quadrature modulator 46 applies quadrature modulation to the input in-phase component and quadrature component (I and Q signals), and the DA converter 37 generates the error signal $S_E$ by converting the digital quadrature-modulated signal (error signal) to an analog signal. The attenuator 38 adjusts the level of the error signal and then the combiner 32 combines the main signal $S_M$ and the error signal $S_E$ and inputs the combined signal to the amplifier.

It should be noted that it is also possible to adopt an arrangement in which the combined signal output from the combiner 32 is input to the amplifier 34 after bring frequency-converted to an RF signal (IF→RF) and the amplifier output signal from the distributor 35 is input to the AD converter 36 after being frequency-converted to an IF signal (RF→IF).

Thus, the amplifier input signal is a signal obtained by adding on a characteristic that is the inverse of the non-linear distortion of the amplifier (a signal that has been subjected to predistortion), and therefore a linear amplified output signal is obtained at the amplifier output.

Figure 8:
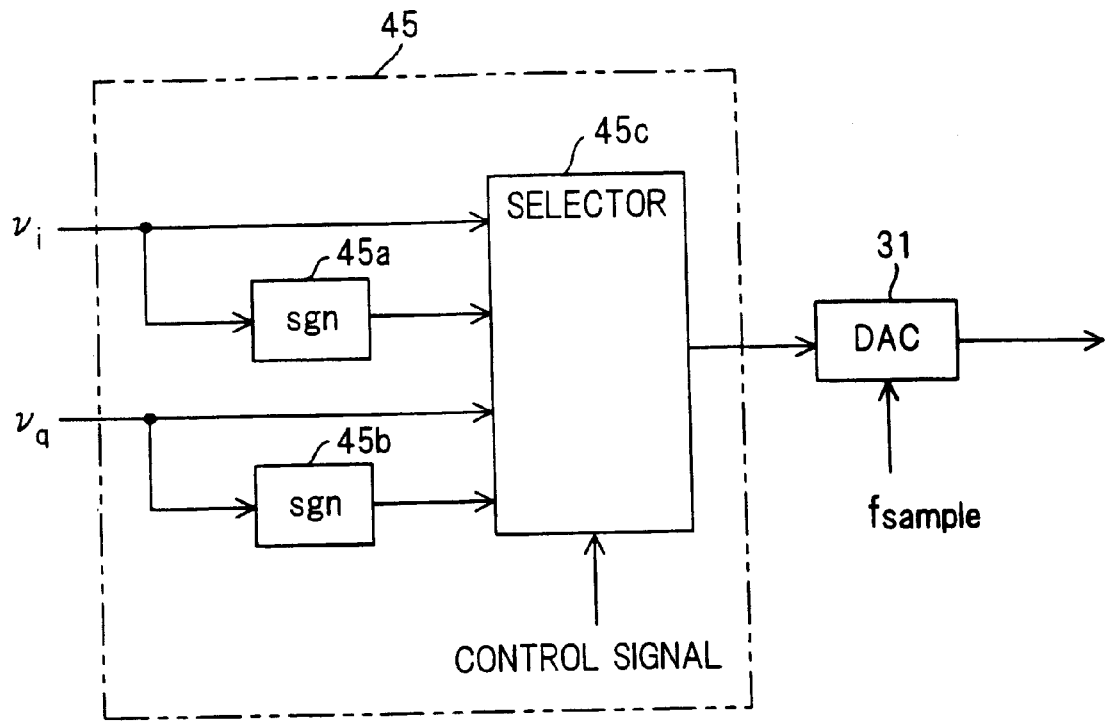
FIG. 8 is a diagram showing the principles of a digital quadrature modulator.

FIG. 8 shows an embodiment of a digital quadrature modulator. A sign add-on unit 45a adds a sign onto an in-phase component $v_i$, and a sign add-on unit 45b adds a sign onto a quadrature component $v_q$. A selector 45c selects baseband signals in accordance with the sequence $v_i(t)$, $-v_q(t+Ts)$, $-v_i(t+2Ts)$, $v_q(t+3Ts)$ (where Ts represents the sampling period), etc., and inputs the baseband signal to the DA converter 31. The latter converts the input signal to an analog signal and outputs the analog signal as the main signal $S_M$. Frequency $f_{IF}$ of the output modulated signal thus obtained and sampling frequency (the changeover frequency of the selector) $f_{sample}$ of the DA converter 31 are related as indicated by the following equation:

$$f_{sample} = 4 \times f_{IF} \qquad (2)$$

Digital quadrature modulation is thus carried out to generate the modulated signal.

Figure 9:
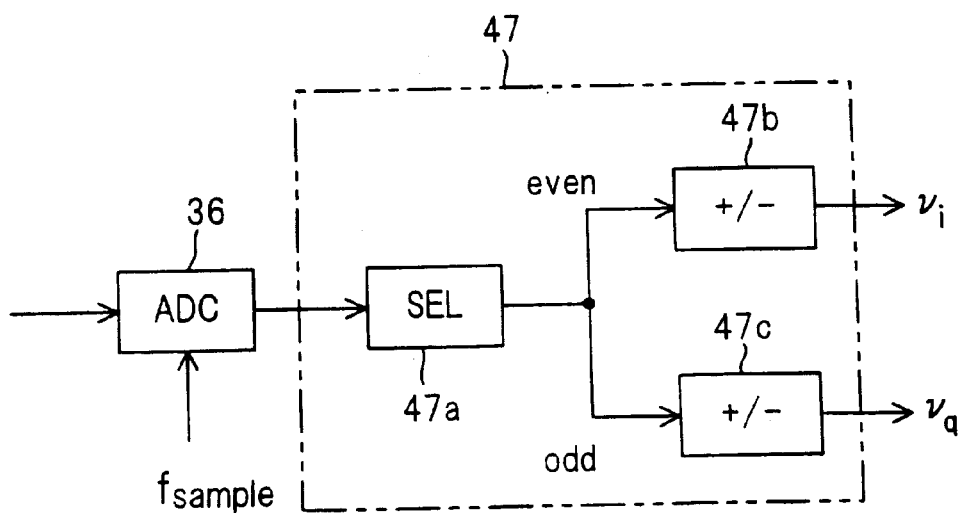
FIG. 9 is a diagram showing the principles of a digital quadrature demodulator.

FIG. 9 shows an embodiment of a digital quadrature demodulator. A receive IF signal (or RF signal) is sampled by the AD converter 36. Quadrature demodulation is performed by selecting the intermediate frequency $f_{IF}$ and $f_{sample}$ so as to satisfy the requirement indicated by the following equation:

$$f_{sample} = 4 \times f_{IF}/(4m+1) \qquad (3)$$

where m represents a natural number. If the in-phase component and quadrature component of a sampled value obtained in accordance with the above requirement are $v_i$ and $v_q$, respectively, then a selector 47a outputs the input signal in accordance with the sequence $v_i(t)$, $-v_q(t+Ts)$, $-v_i(t+2Ts)$, $v_q(t+3Ts)$, etc. That is, the selector 47a divides the output sample sequence into even-numbered and odd-numbered samples, inputs the even-numbered samples to a sign reversing unit 47b and inputs the odd-numbered samples to a sign reversing unit 47c, and the sign reversing units 47b, 47c alternately reverse the signs of their input signals, thereby generating quadrature demodulated results $v_i$, $v_q$. Here $v_i$, $v_q$ are the in-phase and quadrature components, respectively, and are obtained as sample sequences offset from each other in terms of sampling time. Accordingly, sample values of the desired timing are found by interpolation and filtering processing. Digital quadrature detection is thus carried out to obtain the equivalent baseband signal (complex signal).

(D) Fourth Embodiment

Figure 10:
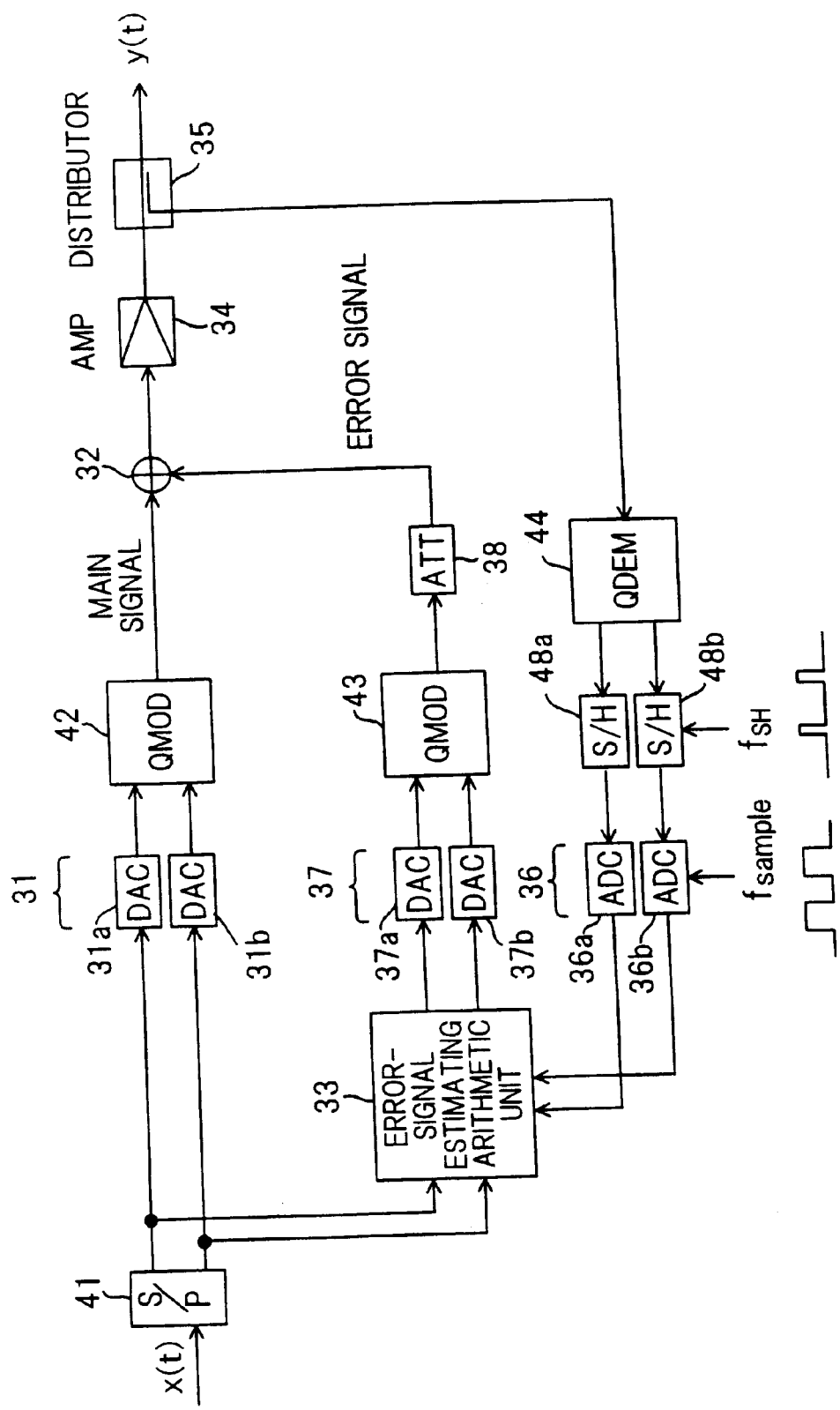
FIG. 10 shows a radio apparatus according to a fourth embodiment of the present invention.

FIG. 10 is a diagram showing the structure of a fourth embodiment of the present invention, in which components identical with those of the second embodiment of FIG. 6 are designated by like reference characters. The fourth embodiment differs from the second embodiment in that sample-and-hold circuits 48a, 48b for sampling and holding the in-phase component and quadrature component output from the quadrature demodulator 44 are provided in front of the AD converters 36a, 36b.

The sampling clock $f_{sample}$ of the AD converters 36a, 36b and a control signal $f_{SH}$ of the sample-and-hold circuits 48a, 48b are supplied independently. The sampling band is decided by the pulse width of the control signal $f_{SH}$, which controls the sampling rate of the sample-and-hold circuits 48a, 48b, and the sampling rate (number of samples per unit time) is decided by the sampling clock $f_{sample}$ of the AD converters.

Figure 11:
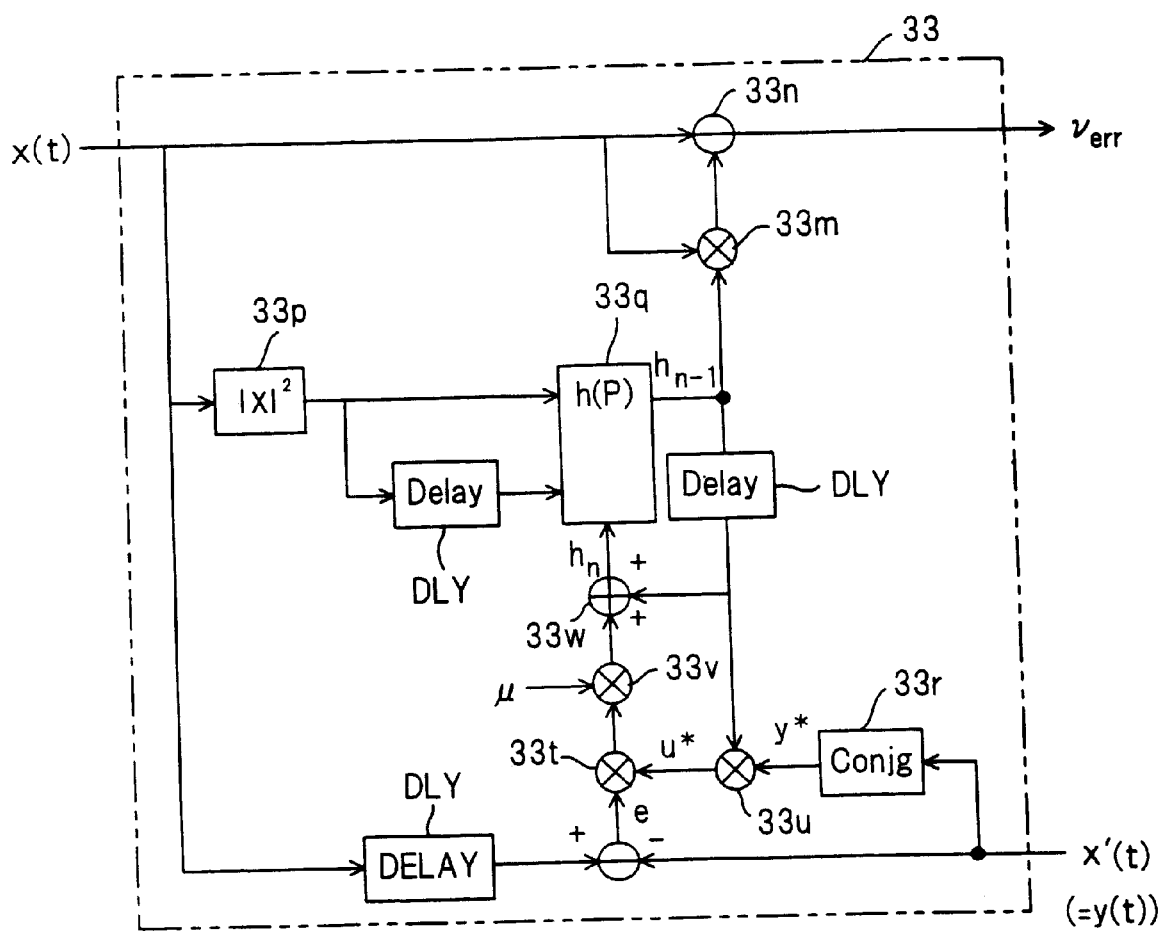
FIG. 11 is a diagram showing the structure of an error-signal estimating arithmetic unit that applies a delay adjustment.

The sample sequence obtained is input to the error-signal estimating arithmetic unit 33 as feedback values and is used to update the distortion compensation coefficients. As shown in FIG. 11, the error-signal estimating arithmetic unit 33 can have a structure that does not require the feedback values to be continuous in time. This makes it possible to perform down sampling in which the sampling rate is set to be lower than the Nyquist rate, which is decided by the sampling band. It should be noted that the error-signal estimating arithmetic unit 33 of FIG. 11 is obtained by adding a delay circuit DLY to the arrangement of FIG. 4.

The sample-and-hold circuits 48a, 48b sample and hold the in-phase component and quadrature component, which is output from the quadrature demodulator 44, in accordance with the control signal $f_{SH}$, and the AD converters 36a, 36b convert the held signals to digital signals in accordance with the sampling clock $f_{sample}$, thereby obtaining the feedback values. The sampling timing of the sample-and-hold circuits 48a, 48b is decided by the band characteristic of the entered distorted signal sampled, and the hold timing is decided by the conversion time necessary to subject the held signal to the AD conversion. Further, the rate of the digital signal fed back to the error-signal estimating arithmetic unit 33 is a rate made to conform to the AD conversion rate.

The error-signal estimating arithmetic unit 33 delays the reference signal (transmit signal) by the delay line DLY, thereby obtaining a reference signal whose time corresponds to that of the feedback signal, calculates a distortion compensation coefficient in accordance with the LMS adaptive algorithm in such a manner that the difference between the delayed reference signal and feedback signal will become zero, and stores the above-mentioned distortion compensation coefficient at an address of the distortion compensation coefficient storage unit 33q indicated by the delayed power value, thereby achieving updating. The updating of the distortion compensation coefficient at this time is carried out at a rate that conforms to the AD conversion rate. Meanwhile, multiplication (predistortion) of the transmit signal by the distortion compensation coefficient is performed at the sampling rate of the transmit signal using a distortion compensation coefficient that has been stored at an address of the distortion compensation coefficient storage unit 33q that corresponds to the undelayed transmit signal. More specifically, predistortion and updating of the distortion compensation coefficient are executed independently using a dual-port RAM or the like.

In accordance with the fourth embodiment, effective feedback values can be sampled under the constraint of device performance in distortion compensation of W-CDMA, which requires a wide band and large dynamic range, by combining, e.g., wide-band sample-and-hold circuits and high-precision AD converters.

(E) Fifth Embodiment

Figure 12:
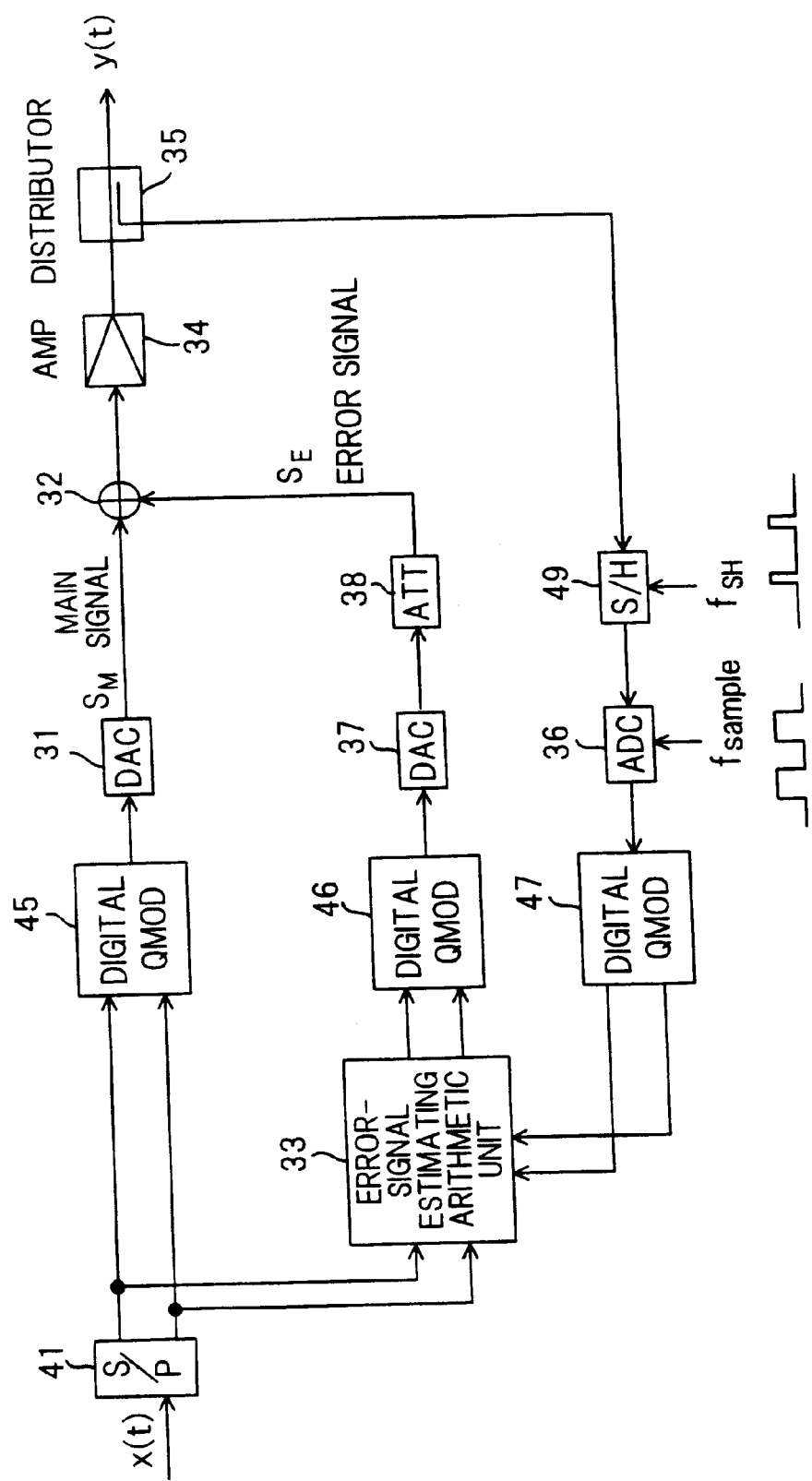
FIG. 12 shows a radio apparatus according to a fifth embodiment of the present invention.

FIG. 12 is a diagram showing the structure of a fifth embodiment, in which components identical with those of the third embodiment of FIG. 7 are designated by like reference characters. This embodiment differs from the third embodiment in that a sample-and-hold circuit 49 for sampling and holding the output signal of the amplifier 34 is provided in front of the AD converter 36.

The sample-and-hold circuit 49 samples and holds the IF signal (or RF signal) in accordance with the control signal $f_{SH}$, the AD converter 36 converts the held signal to a digital signal in accordance with the sampling clock $f_{sample}$, and the digital quadrature demodulator 47 applies quadrature demodulation processing to this digital signal digitally to generate the in-phase component and quadrature component of the feedback signal, and inputs these signals to the error-signal estimating arithmetic unit 33. The relationship between the sampling band and the sampling rate and the operation of the error-signal estimating arithmetic unit are similar to those of the fourth embodiment.

In accordance with the fifth embodiment, effective feedback values can be sampled under the constraint of device performance in distortion compensation of W-CDMA, which requires a wide band and large dynamic range, by combining, a wide-band sample-and-hold circuit and a high-precision AD converters.

(E) Sixth Embodiment

Figure 13:
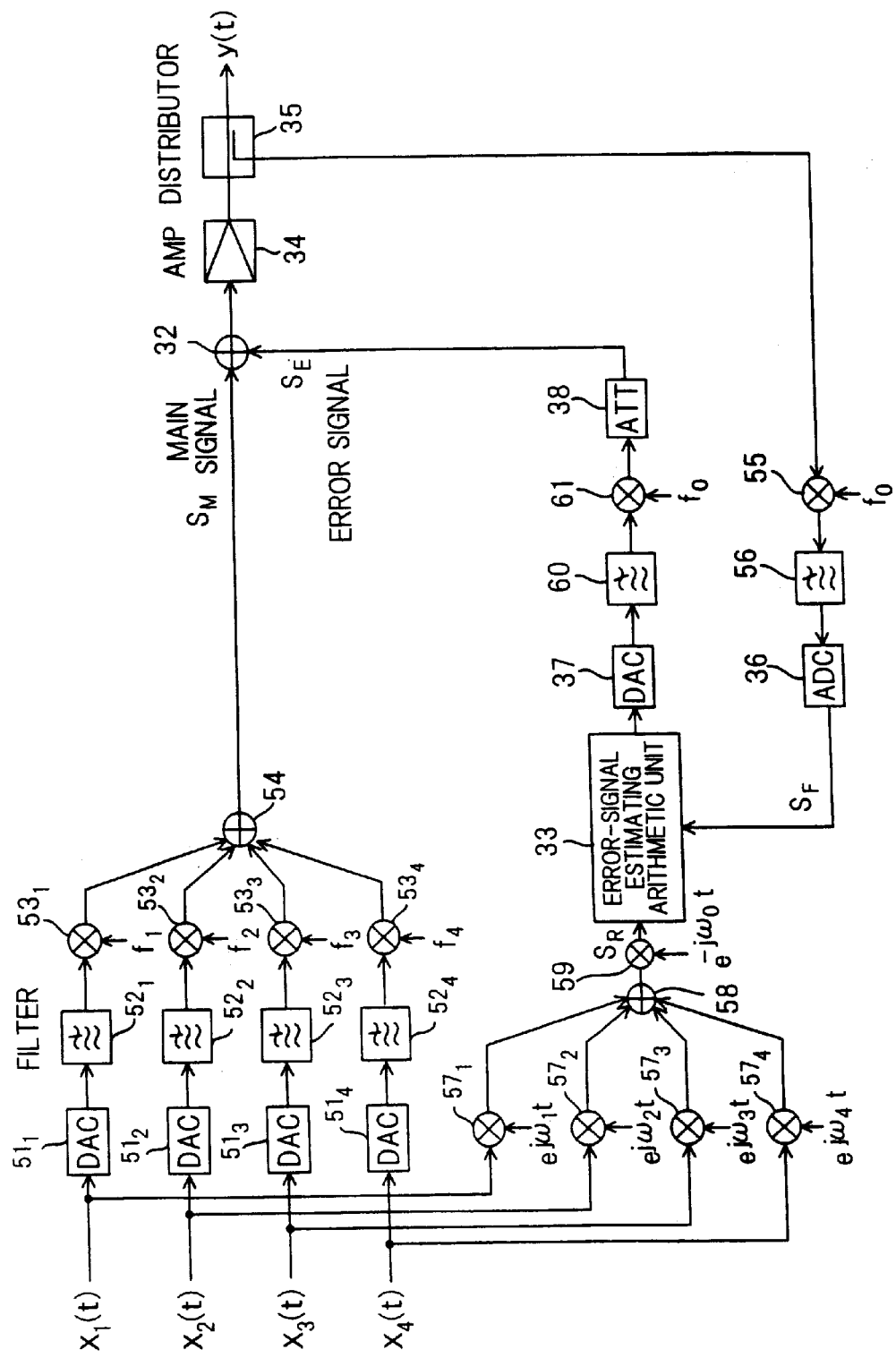
FIG. 13 is a diagram showing the structure of a radio apparatus according to a sixth embodiment of the present invention, this embodiment being for a case where multiple transmit signals are transmitted using a multicarrier signal.

FIG. 13 is a diagram showing the structure of a radio apparatus according to a sixth embodiment of the present invention, this embodiment being for a case where multiple transmit signals are transmitted using a multicarrier signal. This illustrates an example for a case where four frequencies are multiplexed and transmitted. Components identical with those of the first embodiment are designated by like reference characters.

Figure 14:
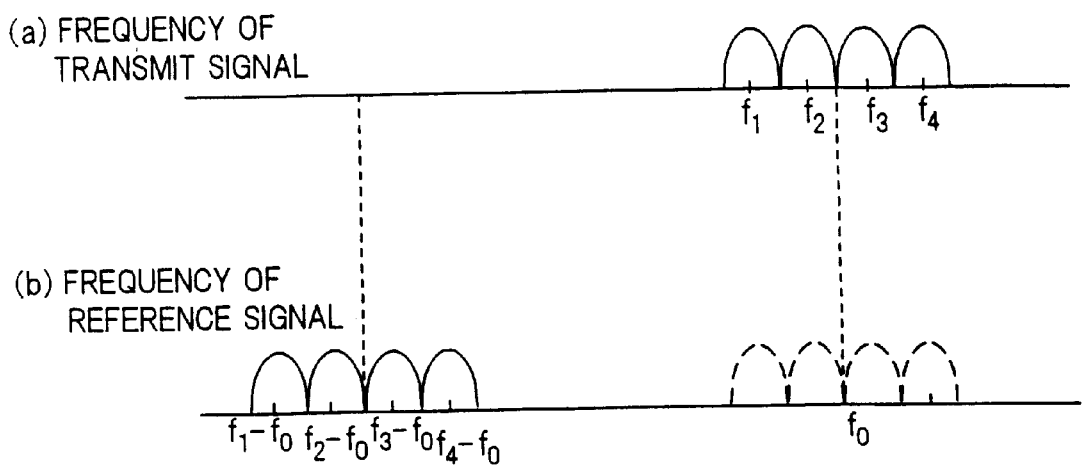
FIG. 14 is a diagram useful in describing a frequency conversion.

Transmit signals $x_1(t)$, $x_2(t)$, $x_3(t)$ and $x_4(t)$ of respective carrier signals are converted to analog signals by independent DA converters $51_1 \sim 51_4$, respectively, the analog signals are frequency-converted to desired carrier frequencies $f_1$, $f_2$, $f_3$, $f_4$ by frequency converters $53_1 \sim 53_4$ after passage through filters $52_1 \sim 52_4$ [see (a) of FIG. 14], and the signals are frequency-multiplexed by a combiner 54.

The frequency-multiplexed (main signal) $S_M$ obtained is combined in the combiner 32 with the error signal $S_E$ output from the error-signal estimating arithmetic unit 33, and the combined signal is input to the power amplifier (amp) 34. Part of the amplifier output is branched by the distributor 35, such as the directional coupler, and is frequency-converted to a frequency-multiplexed signal of frequencies $f_1$-$f_0$, $f_2$-$f_0$, $f_3$-$f_0$, $f_4$-$f_0$ by a frequency converter 55. This signal is AD-converted by the AD converter 36 after passage through a filter 56 and becomes the feedback signal $S_F$.

Meanwhile, the digital values of the transmit signals $x_1(t)$, $x_2(t)$, $x_3(t)$, $x_4(t)$ are multiplied by $\exp(j\omega_1 t)$, $\exp(j\omega_2 t)$, $\exp(j\omega_3 t)$, $\exp(j\omega_4 t)$ ($\omega_n = 2\pi f_n$), respectively, by frequency shifters $57_1 \sim 57_4$, respectively, to effect a frequency shift to frequencies $f_1$, $f_2$, $f_3$, $f_4$, after which these frequencies are frequency-multiplexed by a combiner 58. This digital frequency-multiplexed signal is a signal equivalent to the main signal $S_M$ obtained by combining the above-mentioned individual carrier signals in analog fashion. A frequency shifter 59 subsequently multiplies this digital frequency-multiplexed signal by $\exp(-j\omega_0 t)$ to effect a conversion to the frequency multiplexed signal of frequencies $f_1$-$f_0$, $f_2$-$f_0$, $f_3$-$f_0$, $f_4$-$f_0$ [see (b) of FIG. 14] and inputs this signal to the error-signal estimating arithmetic unit 33 as a reference signal $S_R$.

An arrangement can also be adopted in which the frequency shifter 59 is deleted and multiplication by $\exp[j(\omega_1-\omega_0)t]$, $\exp[j(\omega_2-\omega_0)t]$, $\exp[j(\omega_3-\omega_0)t]$, $\exp[j(\omega_4-\omega_0)t]$ is performed by the frequency shifters $57_1 \sim 57_4$. This holds true also for embodiments below. Further, in a case where a frequency shift of $f_0$ is not performed by the frequency converter 55, the frequency shifter 59 and a frequency converter 61, described later, will be unnecessary.

The error-signal estimating arithmetic unit 33 uses the reference signal $S_R$ and the feedback signal $S_F$ to calculate an error signal ascribable to non-linear distortion of the amplifier. The DA converter 37 DA-converts the obtained error signal and inputs the analog signal to the frequency converter 61 via a filter 60. The frequency converter 61 multiplies the error signal by a signal of frequency $f_0$ to thereby up-convert the error signal frequency. After the signal has its level adjusted by the attenuator, it is combined with the main signal. The attenuator 38 adjusts the level of the error signal and then the combiner 32 combines the main signal $S_M$ and the error signal $S_E$ and inputs the combined signal to the amplifier. Thus there is obtained a signal that is the result of adding a characteristic that is the inverse of the non-linear distortion of the amplifier to the frequency-multiplexed signal (main signal).

(G) Seventh Embodiment

Figure 15:
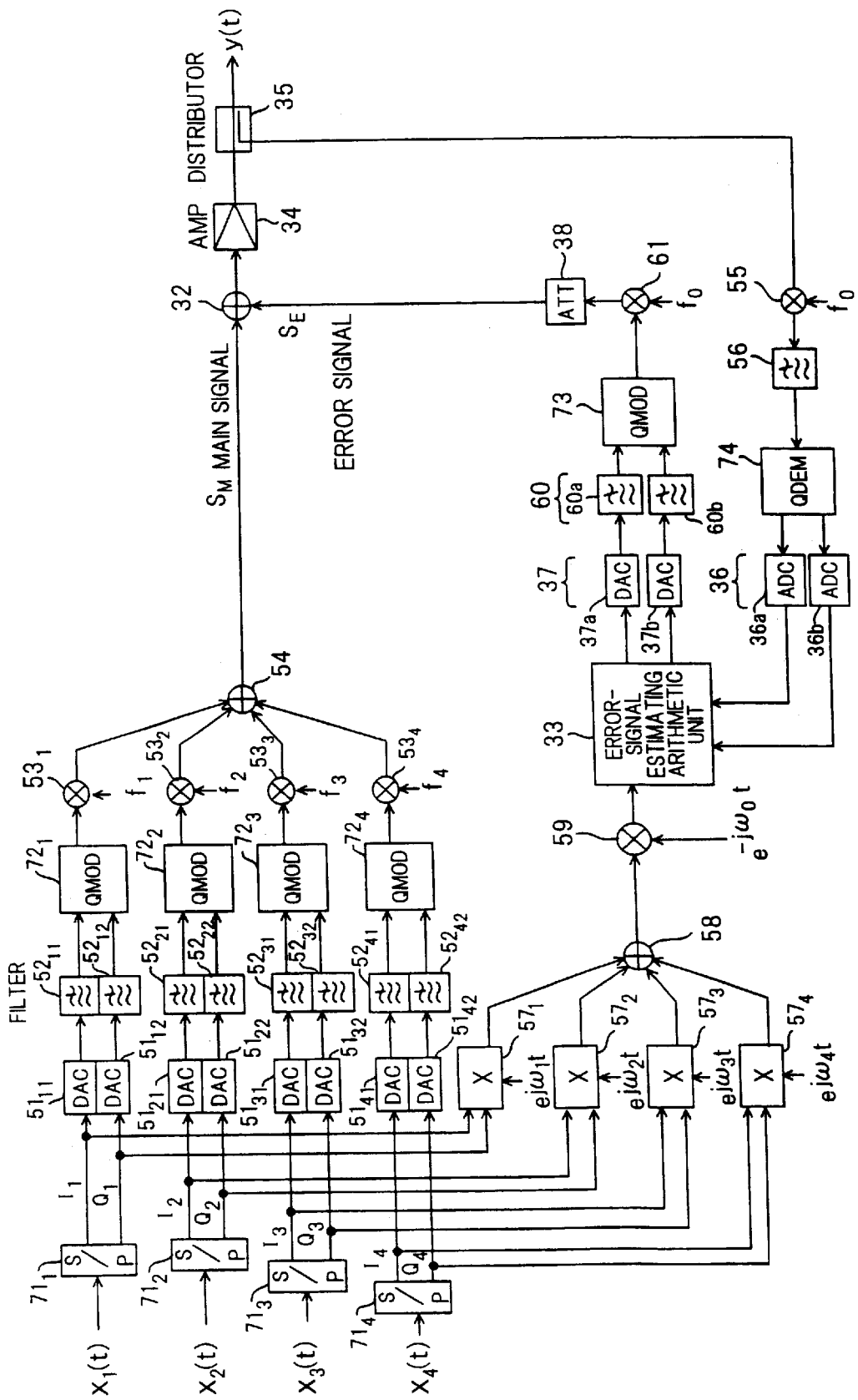
FIG. 15 shows a seventh embodiment for a case where a transmit signal is processed upon being converted to quadrature signals (use of analog quadrature modulator/demodulator)

FIG. 15 shows a seventh embodiment for a case where the transmit signals are processed upon being converted to quadrature signals. Components identical with those of the sixth embodiment of FIG. 13 are designated by like reference characters. The seventh embodiment differs from the sixth embodiment in that the transmit signals, error signal and feedback signal are calculated in an equivalent baseband system (complex coordinate system). To accomplish this, there are provided S/P converters $71_1 \sim 71_4$ for converting the transmit signals $x_1(t) \sim x_4(t)$ to quadrature signals (I and Q signals), quadrature modulators $72_1 \sim 72_4$, 73 and a quadrature demodulator 74. Further, DA converters $51_{11}$, $51_{12} \sim 51_{41}$, $51_{42}$ for DA-converting each of the in-phase and quadrature components of the transmit signals are provided as the DA converters $51_1 \sim 51_4$, DA converters 37a, 37b for DA-converting the in-phase and quadrature components of the error signal are provided as the DA converter 37, and the AD converters 36a, 36b for AD-converting the in-phase and quadrature components of the feedback signal are provided as the AD converter 36.

The S/P converters $71_1 \sim 71_4$ convert the transmit signals $x_1(t) \sim x_4(t)$ to quadrature signals, and the DA converters $51_{11}$, $51_{12} \sim 51_{41}$, $51_{42}$ convert the in-phase and quadrature components of each of the quadrature signals to analog signals and input the analog signals to the quadrature modulators $72_1 \sim 72_4$. The latter apply quadrature modulation to the in-phase and quadrature components (I and Q signals) that enter from the corresponding DA converters $51_{11}$, $51_{12} \sim 51_{41}$, $51_{42}$, the frequency converters $53_1 \sim 53_4$ up-convert the frequencies of the quadrature-modulated signals to the desired carrier frequencies $f_1$, $f_2$, $f_3$, $f_4$, and the combiner 54 performs frequency multiplexing to generate the main signal $S_M$.

The combiner 32 combines the main signal $S_M$ with the error signal $S_E$ output from the error-signal estimating arithmetic unit 33 and inputs the combined signal to the power amplifier (amp) 34. The distributor 35 branches part of the amplifier output and the frequency converter 55 performs a down-conversion to a frequency-multiplexed signal of frequencies $f_1$-$f_0$, $f_2$-$f_0$, $f_3$-$f_0$, $f_4$-$f_0$ and inputs this signal to the quadrature demodulator 74 via the filter 56. The quadrature demodulator 74 subjects the input signal to quadrature demodulation processing to reconstruct the baseband signals on the transmit side, the I, Q signals are input to the AD converters 36a, 36b and these AD converters subject the I, Q signals to an AD conversion and input the results to the error-signal estimating arithmetic unit 33 as the feedback signal.

Meanwhile, quadrature signals obtained by subjecting the transmit signals $x_1(t)$, $x_2(t)$, $x_3(t)$, $x_4(t)$ to a quadrature conversion are multiplied by $\exp(j\omega_1 t)$, $\exp(j\omega_2 t)$, $\exp(j\omega_3 t)$, $\exp(j\omega_4 t)$ ($\omega_n = 2\pi f_n$), respectively, by the frequency shifters $57_1 \sim 57_4$, respectively, to effect a frequency shift to frequencies $f_1$, $f_2$, $f_3$, $f_4$, after which these frequencies are frequency-multiplexed by the combiner 58. The frequency shifter 59 subsequently multiplies this digital frequency-multiplexed signal by exp(−jω₀t) to effect a conversion to the frequency multiplexed signal of frequencies $f_1-f_0$, $f_2-f_0$, $f_3-f_0$, $f_4-f_0$ and inputs this signal to the error-signal estimating arithmetic unit 33 as the reference signal $S_R$.

The error-signal estimating arithmetic unit 33 uses the reference signal and the feedback signal to calculate an error signal ascribable to non-linear distortion of the amplifier. The DA converters 37a, 37b DA-convert the in-phase and quadrature components of the obtained error signal and input the analog signals to the quadrature modulator 73 via filters 60a, 60b. The quadrature modulator 73 subjects the input signals to quadrature modulation and inputs the modulated signal to the frequency converter 61. The latter multiplies the error signal by the signal of frequency $f_0$ to up-convert the error signal frequency. The attenuator 38 adjusts the level of the error signal and then the combiner 32 combines the level-adjusted error signal with the main signal and inputs the combined signal to the amplifier. Thus there is obtained a frequency-multiplexed signal that is the result of adding on a characteristic that is the inverse of the non-linear distortion of the amplifier.

(H) Eighth Embodiment

Figure 16:
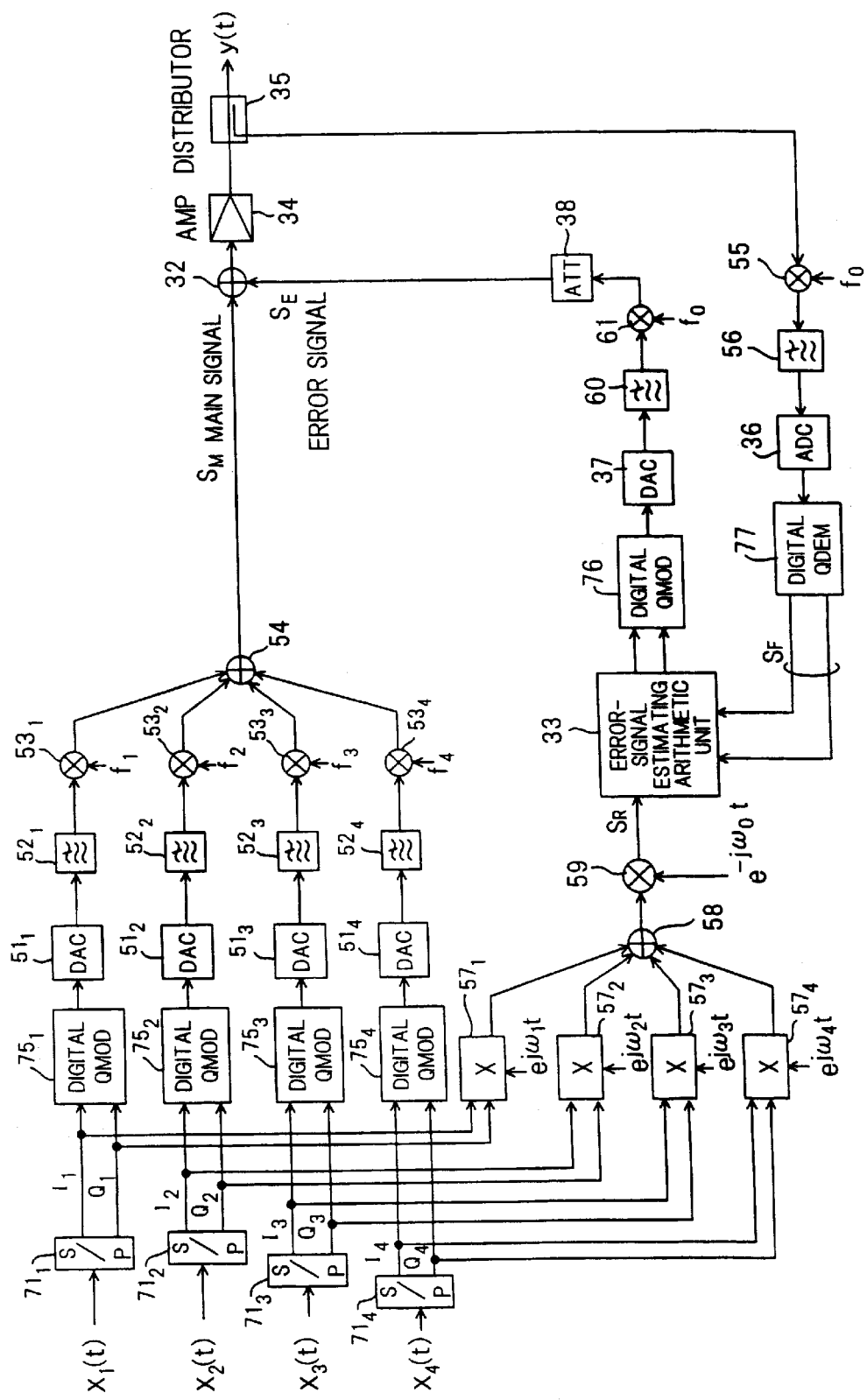
FIG. 16 shows an eighth embodiment for a case where a transmit signal is processed upon being converted to quadrature signals (use of digital quadrature modulator/demodulator)

FIG. 16 shows an eighth embodiment for a case where the transmit signals are processed upon being converted to quadrature signals. Components identical with those of the sixth embodiment of FIG. 13 are designated by like reference characters. The eighth embodiment differs from the sixth embodiment in that the transmit signals, error signal and feedback signal are calculated in an equivalent baseband system (complex coordinate system). The S/P converters $71_1$~$71_4$ are provided and so are digital quadrature modulators $75_1$~$75_4$, 76 and a digital quadrature demodulator 77.

The S/P converters $71_1$~$71_4$ convert the transmit signals $x_1(t)$, $x_2(t)$, $x_3(t)$, $x_4(t)$ to quadrature signals (I and Q signals), the digital quadrature modulators $75_1$~$75_4$ apply digital quadrature modulation to the in-phase and quadrature components (I and Q signals) of each of the quadrature signals, and the DA converters $51_1$~$51_4$ convert the digital quadrature-modulated signals to analog signals and input the analog signals to the frequency converters $53_1$~$53_4$ via the filters. The frequency converters $53_1$~$53_4$ up-convert the frequencies of the quadrature-modulated signals to the desired carrier frequencies $f_1$, $f_2$, $f_3$, $f_4$ and the combiner 54 performs frequency multiplexing to generate the main signal $S_M$.

The combiner 32 combines the main signal $S_M$ with the error signal $S_E$ output from the error-signal estimating arithmetic unit 33 and inputs the combined signal to the power amplifier (amp) 34. The distributor 35 branches part of the amplifier output and the frequency converter 55 performs a down-conversion to a frequency-multiplexed signal of frequencies $f_1-f_0$, $f_2-f_0$, $f_3-f_0$, $f_4-f_0$ and inputs this signal to the AD converter 36 the filter 56. The AD converter 36 converts the input signal to a digital signal and inputs the digital signal to the digital quadrature demodulator 47. The latter subjects the input signal to quadrature demodulation processing to reconstruct the baseband signals on the transmit side, and the in-phase and quadrature components are input to the error-signal estimating arithmetic unit 33 as the feedback signal.

Meanwhile, quadrature signals obtained by subjecting the transmit signals $x_1(t)$, $x_2(t)$, $x_3(t)$, $x_4(t)$ to a quadrature conversion are multiplied by exp(jω₁t), exp(jω₂t), exp(jω₃t), exp(jω₄t) ($ω_n=2πf_n$), respectively, by the frequency shifters $57_1$~$57_4$, respectively, to effect a frequency shift to frequencies $f_1$, $f_2$, $f_3$, $f_4$, after which these frequencies are frequency-multiplexed by the combiner 58. The frequency shifter 59 subsequently multiplies this digital frequency-multiplexed signal by exp(−jω₀t) to effect a conversion to the frequency multiplexed signal of frequencies $f_1-f_0$, $f_2-f_0$, $f_3-f_0$, $f_4-f_0$ and inputs this signal to the error-signal estimating arithmetic unit 33 as the reference signal $S_R$.

The error-signal estimating arithmetic unit 33 uses the reference signal and the feedback signal to calculate an error signal ascribable to non-linear distortion of the amplifier and inputs the in-phase component and quadrature component of this signal to the transmit-data processing unit 76. The latter applies quadrature modulation to the input in-phase and quadrature components (I and Q signals), and the DA converter 37 converts the digital quadrature-modulated signal (error signal) to an analog signal and inputs the modulated signal to the frequency converter 61 via the filter 60. The frequency converter 61 multiplies the error signal by the signal of frequency $f_0$ to up-convert the frequency. The attenuator 38 adjusts the level of the error signal and the combiner 32 combines the level-adjusted error signal with the main signal and inputs the combined signal to the amplifier. Thus there is obtained a frequency-multiplexed signal that is the result of adding on a characteristic that is the inverse of the non-linear distortion of the amplifier.

(I) Ninth Embodiment

Figure 17:
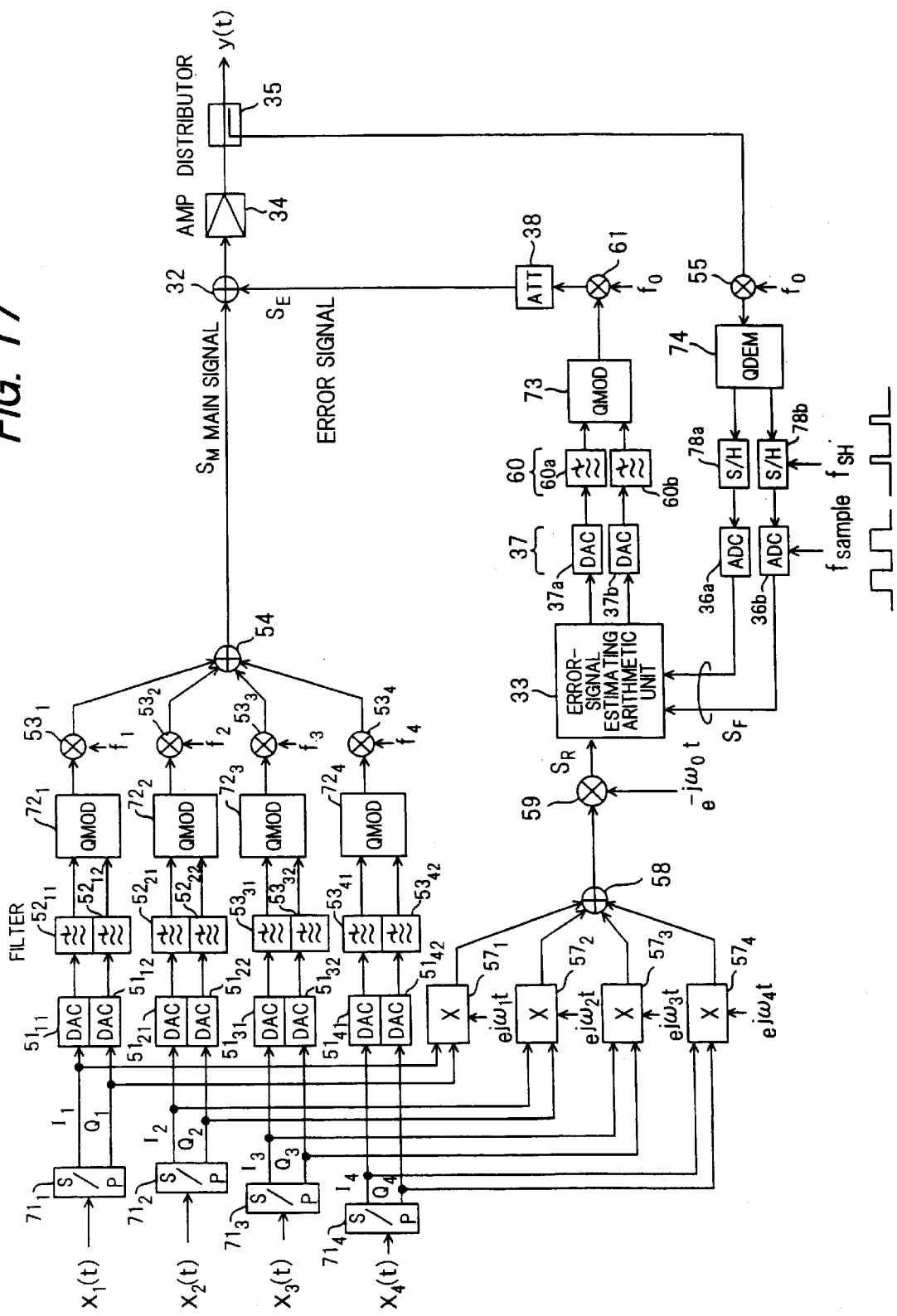
FIG. 17 shows a ninth embodiment for a case where a transmit signal is processed upon being converted to quadrature signals (use of sample-and-hold circuits and analog quadrature modulator/demodulator)

FIG. 17 is a diagram showing the structure of a ninth embodiment of the present invention, in which components identical with those of the seventh embodiment of FIG. 15 are designated by like reference characters. This embodiment differs from the seventh embodiment in that sample-and-hold circuits 78a, 78b for sampling and holding the in-phase component and quadrature component output from the quadrature demodulator 74 are provided in front of the AD converters 36a, 36b. The operation of the sample-and-hold circuits 78a, 78b, AD converters 36a, 36b and error-signal estimating arithmetic unit 33 is identical with that of the fourth embodiment of FIG. 10 and the same effects are obtained.

(J) Tenth Embodiment

Figure 18:
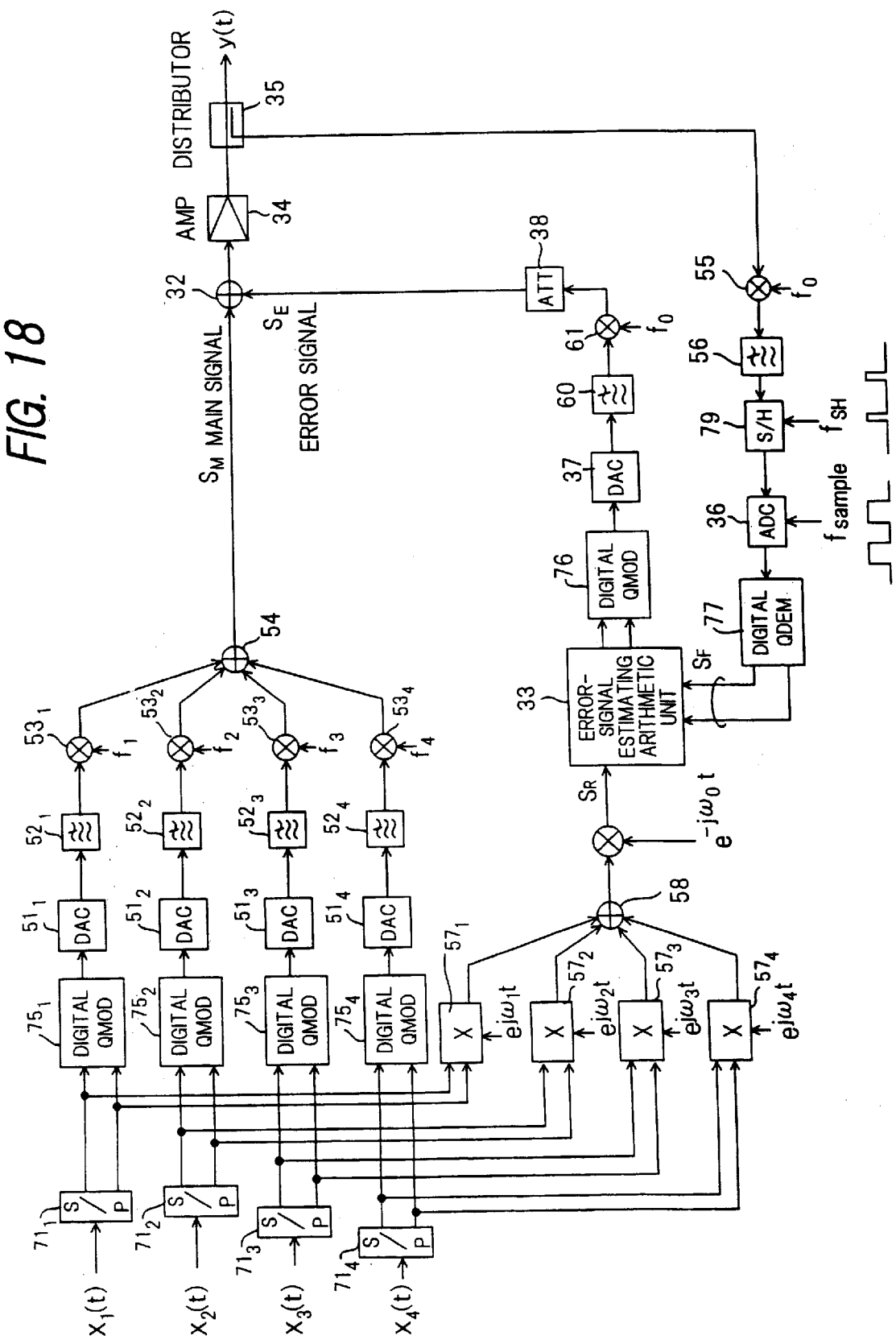
FIG. 18 shows a tenth embodiment for a case where a transmit signal is processed upon being converted to quadrature signals (use of a sample-and-hold circuit and digital quadrature modulator/demodulator)

FIG. 18 is a diagram showing the structure of a tenth embodiment of the present invention, in which components identical with those of the eighth embodiment of FIG. 16 are designated by like reference characters. This embodiment differs from the eighth embodiment in that a sample-and-hold circuit 79 for sampling and holding the output signal of the amplifier 34 is provided in front of the AD converter 36. The operation of the sample-and-hold circuit 79, AD converter 36 and error-signal estimating arithmetic unit 33 is identical with that of the fifth embodiment of FIG. 13 and the same effects are obtained.

(K) 11th Embodiment

Figure 19:
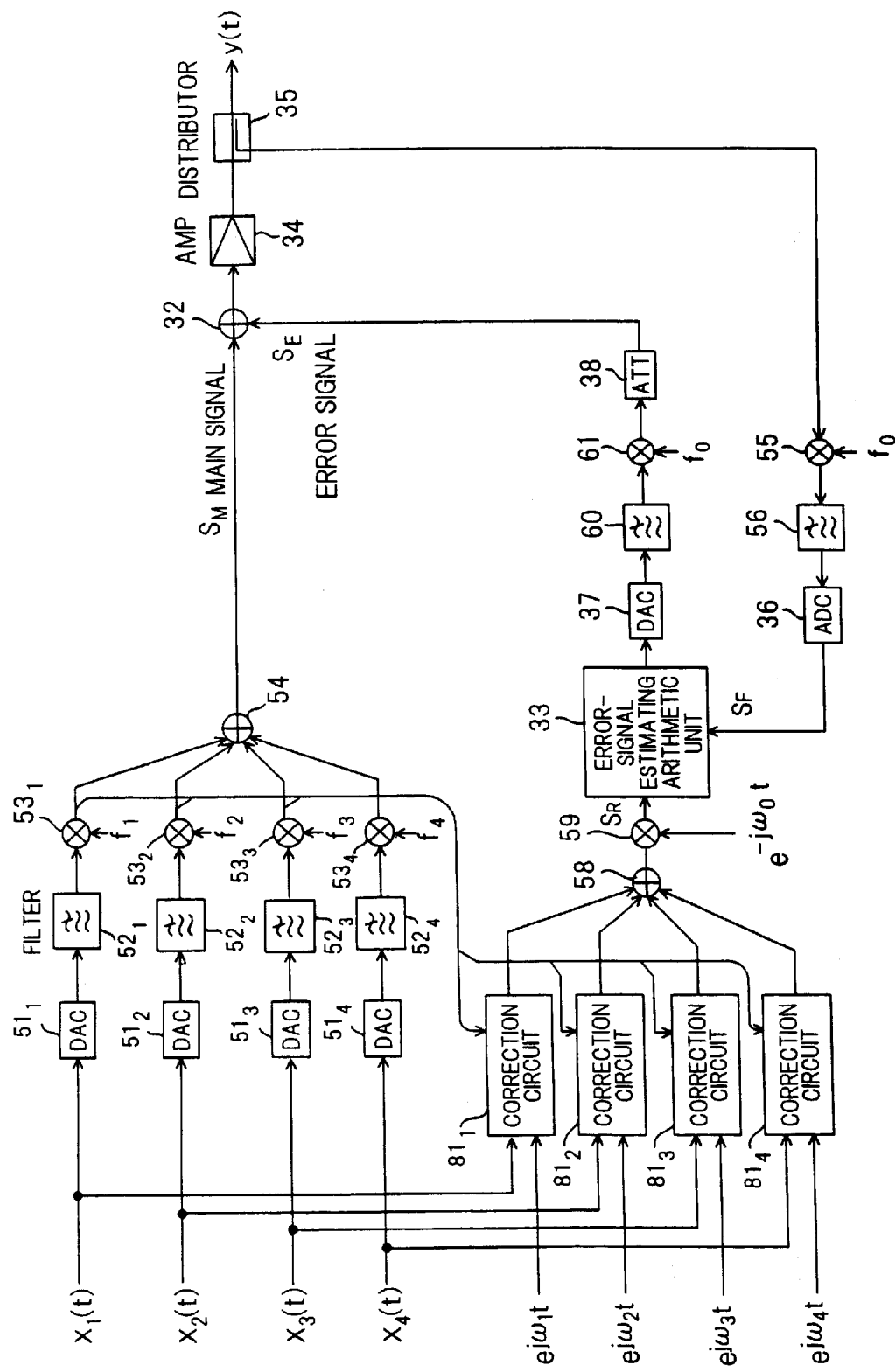
FIG. 19 shows an 11$^{th}$ embodiment of a radio apparatus having a function for correcting amplitude and phase of a reference signal.

FIG. 19 is a diagram showing the structure of a radio apparatus according to an 11$^{th}$ embodiment having a function for correcting the amplitude and phase of a reference signal. Components identical with those of the sixth embodiment of FIG. 13 are designated by like reference characters. This embodiment differs in that correction circuits $81_1$~$81_4$ are provided instead of the frequency shifters $57_1$~$57_4$ to correct the amplitude and phase of the reference signal in such a manner that the frequency-multiplexed signal (reference signal), which is output from the combiner 58, will agree with the main signal $S_M$ output from the combiner 54. The correction circuits $81_1$~$81_4$ compare, on a per-carrier basis, signals obtained through frequency conversion by the frequency converters $53_1$~$53_4$ with signals obtained through frequency shifting of the transmit baseband signals $x_1(t)$~$x_4(t)$ by digital processing, and exercise control in such a manner that the differences between these signals become zero, thereby making the reference signal coincide with the main signal.

Figure 20:
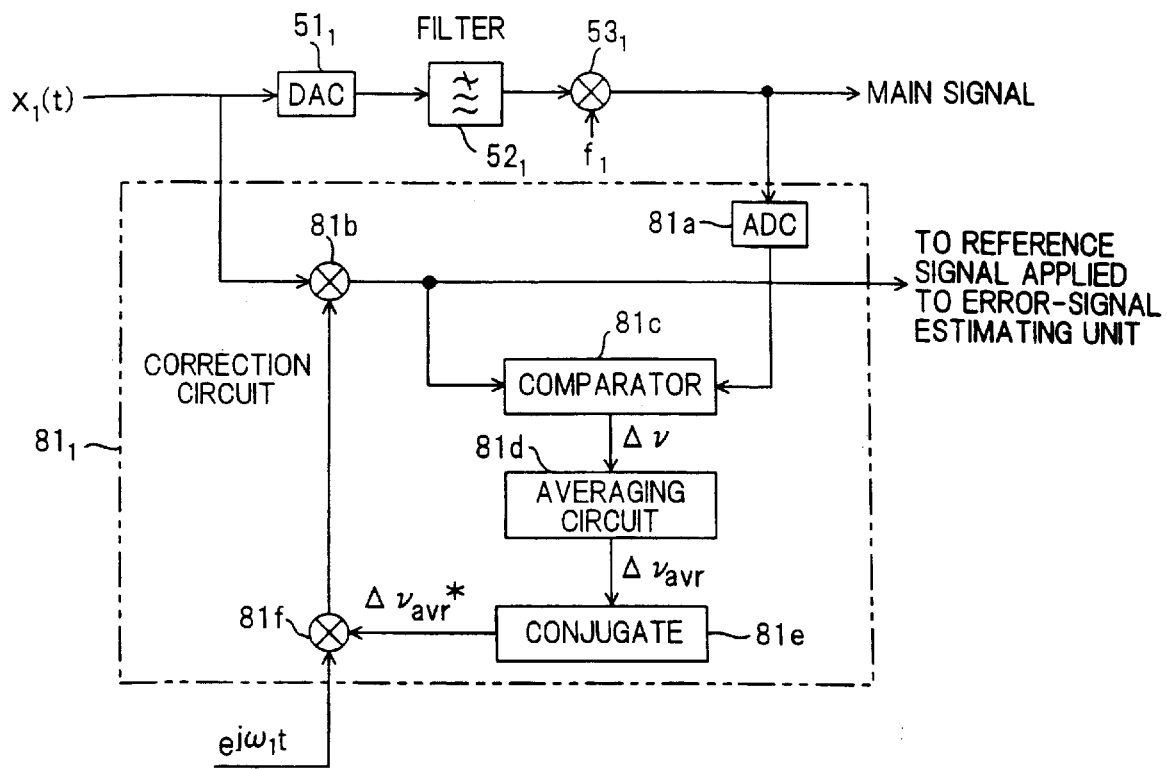
FIG. 20 is a diagram showing the structure of a correction circuit.

FIG. 20 is a diagram showing the structure of the correction circuit $81_1$; the other correction circuits $81_2$~$81_4$ are similarly constructed. An AD converter 81a converts the frequency-converted signal output from the frequency converter $53_1$ to a digital signal, and a multiplier 81b initially multiplies the transmit signal $x_1(t)$ by $\exp(j\omega t)$ to output a signal obtained by digitally shifting the frequency of the transmit signal $x_1(t)$. A comparator 81c detects an amplitude difference $v_d$ and a phase difference $\phi_d$ between these two input signals and obtains an error $\Delta v = v_d \cdot \exp(j\phi_d)$. An averaging circuit 81d averages the output of the comparator 81c to generate an average error $\Delta v_{avr}$, a complex-conjugate signal output unit 81e generates a complex-conjugate value $\Delta v_{avr}^*$ of the average error $\Delta v_{avr}$, a multiplier 81f multiplies $\exp(j\omega t)$ by $\Delta v_{avr}^*$, and a multiplier 81 multiplies the transmit signal $x_1(t)$ by $\Delta v_{avr}^* \cdot \exp(j\omega t)$. By repeating the above-described control, the amplitude difference $v_d$ and phase difference $\phi_d$ between the two signals input to the comparator 81c will be reduced to zero.

Figure 21:
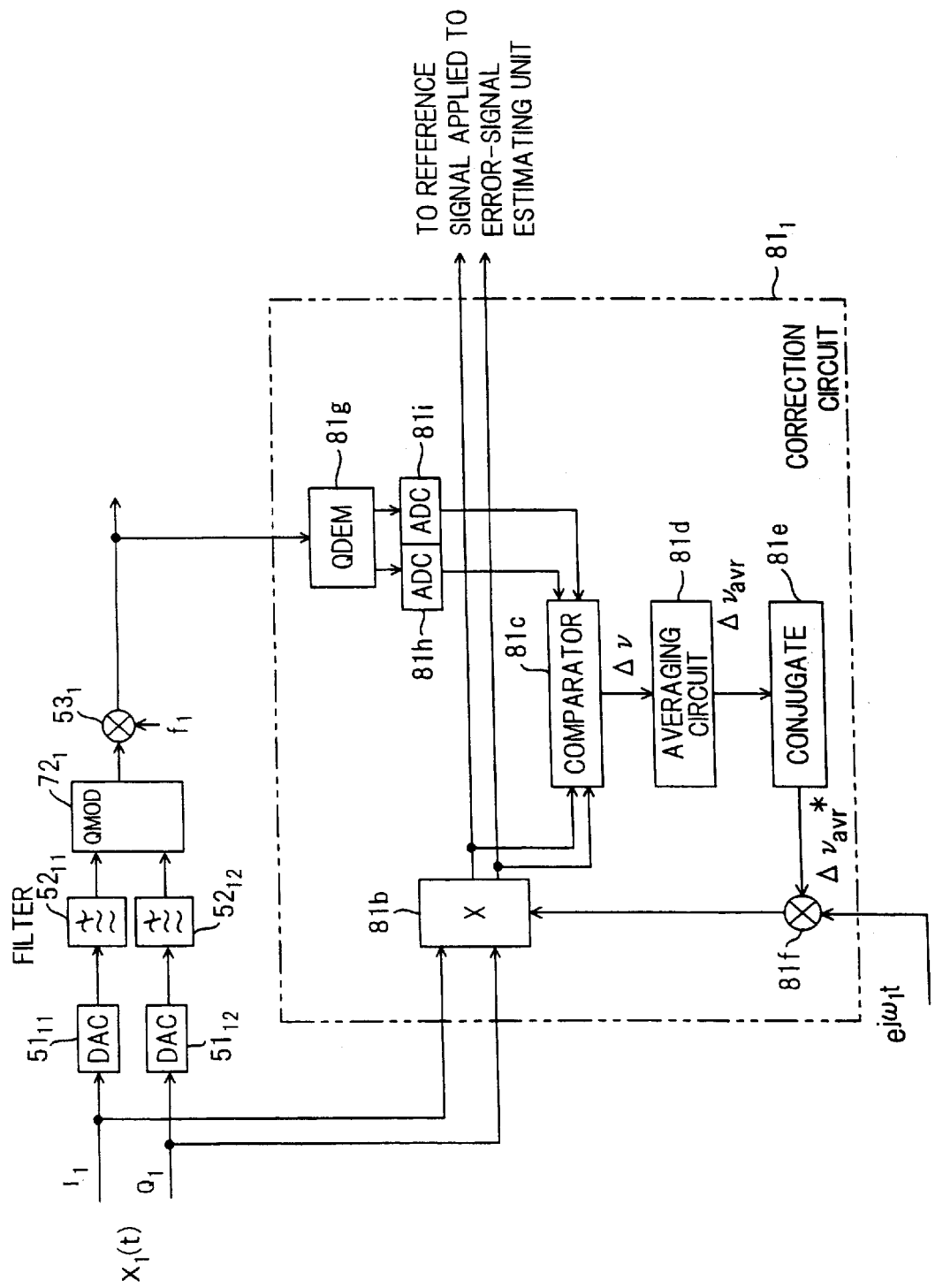
FIG. 21 is a diagram showing the structure of a correction circuit applicable to the radio apparatus of the seventh embodiment.

FIG. 21 is a diagram showing the structure of a correction circuit applicable to the seventh embodiment of FIG. 15. Components identical with those of the correction circuit of FIG. 20 are designated by like reference characters. This circuit differs in that a quadrature demodulator 81g and AD converters 81h, 81i are provided instead of the AD converter 81a. The quadrature demodulator, 81g applies quadrature demodulation processing to the output signal of the frequency converter $53_1$, and the AD converters 81h, 81i convert the in-phase and quadrature components output from the quadrature demodulator to digital signals and input the digital signals to the comparator 81c. Meanwhile, the multiplier 81b outputs a signal obtained by digitally shifting the frequency of the baseband transmit signal $x_1(t)$. The comparator 81c detects the amplitude difference $v_d$ and the phase difference $\phi_d$ between these two input signals, and the correction circuit subsequently exercises control in such a manner that the difference between these signals becomes zero, in a manner similar to that of FIG. 20.

Figure 22:
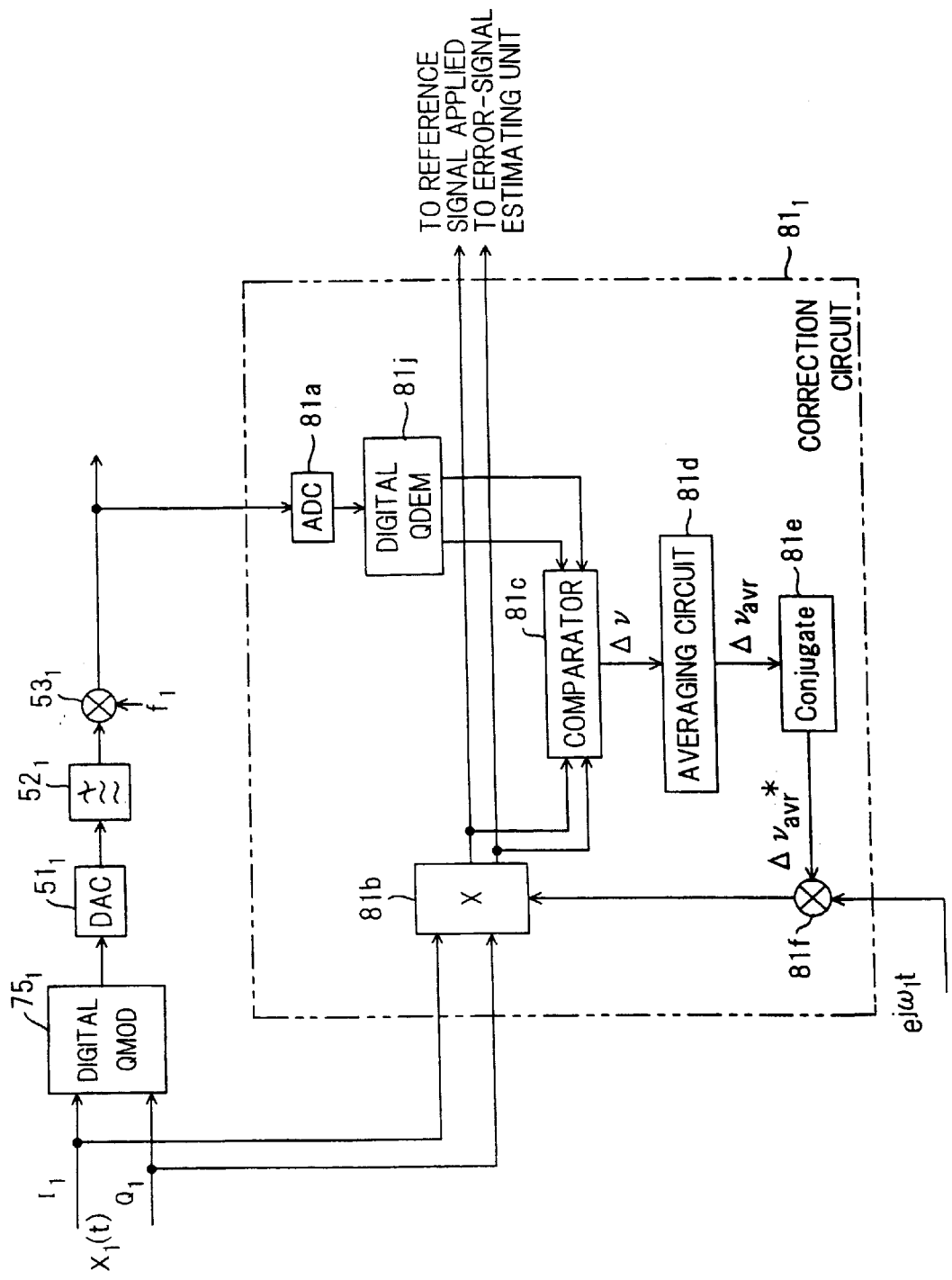
FIG. 22 is a diagram showing the structure of a correction circuit applicable to the radio apparatus of the eighth embodiment.

FIG. 22 is a diagram showing the structure of a correction circuit applicable to the eighth embodiment of FIG. 16. Components identical with those of the correction circuit of FIG. 20 are designated by like reference characters. This circuit differs in that a digital quadrature demodulator 81j is provided on the output side of the AD converter 81a. The AD converter 81a converts the output signal of the frequency converter $53_1$ to a digital signal, and the quadrature demodulator 81j applies quadrature demodulation processing digitally to the output signal of the signal of the AD converter and inputs the in-phase and quadrature components of the demodulated signal to the comparator 81. Meanwhile, the multiplier 81b outputs a signal obtained by digitally shifting the frequency of the baseband transmit signal $x_1(t)$. The comparator 81c detects the amplitude difference $v_d$ and the phase difference $\phi_d$ between these two input signals, and the correction circuit subsequently exercises control in such a manner that the difference between these signals becomes zero, in a manner similar to that of FIG. 20.

(L) 12th Embodiment

Figure 23:
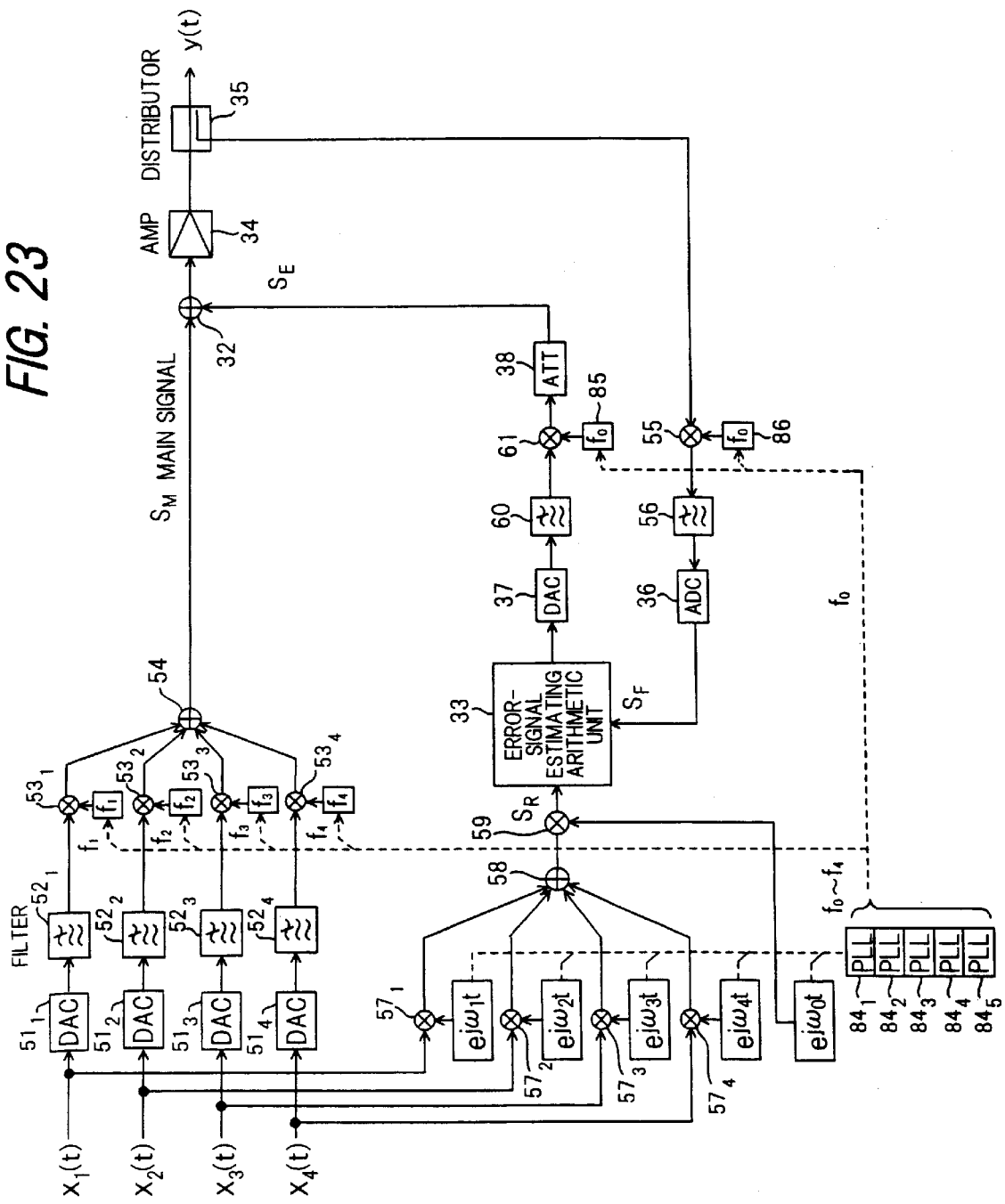
FIG. 23 shows a radio apparatus according to a 12th embodiment of the present invention.

FIG. 23 is a diagram showing the structure of a radio apparatus according to an 12th embodiment of the present invention, in which components identical with those of the sixth embodiment of FIG. 13 are designated by like reference characters. This embodiment differs in that PLL circuits $84_0$~$84_4$, which are synchronized to $\exp(j\omega_0 t)$, $\exp(j\omega_1 t)$ ~$\exp(j\omega_4 t)$ generated when frequency is shifted digitally, are provided and supply local signals of frequencies $f_0$, $f_1$~$f_4$ used when a frequency conversion is performed in analog fashion. In accordance with the 12th embodiment, the frequencies of an analog frequency-multiplexed signal and digital frequency-matched signal can be synchronized, thereby making it possible to raise the precision of distortion compensation.

(M) 13th Embodiment

Figure 24:
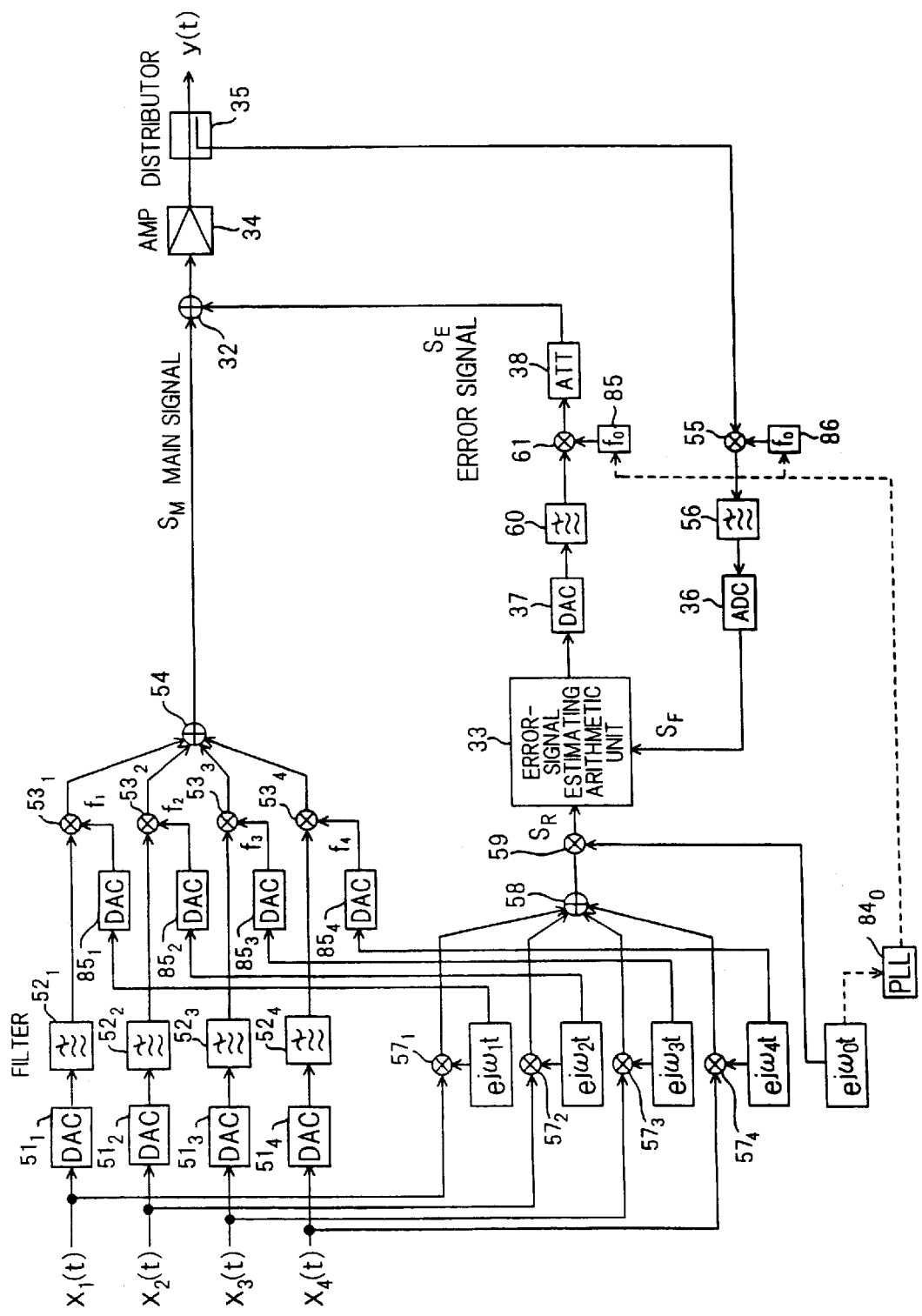
FIG. 24 shows a radio apparatus according to a 13th embodiment of the present invention.

FIG. 24 is a diagram showing the structure of a radio apparatus according to an 13th embodiment of the present invention, in which components identical with those of the sixth embodiment of FIG. 13 are designated by like reference characters. This embodiment differs in that DA converters $85_1$~$85_4$ are provided and generate local signals of frequencies $f_0$, $f_1$~$f_4$ by DA-converting $\exp(j\omega_1 t)$~$\exp(j\omega_4 t)$ generated when frequency is shifted digitally. In accordance with the 13th embodiment, the frequencies of an analog frequency-multiplexed signal and digital frequency-matched signal can be synchronized, thereby making it possible to raise the precision of distortion compensation. It should be noted that the local signal of frequency $f_0$ is generated by the PLL circuit $84_0$ synchronized to $\exp(j\omega_0 t)$ in accordance with the 12th embodiment.

(N) 14th Embodiment

Figure 25:
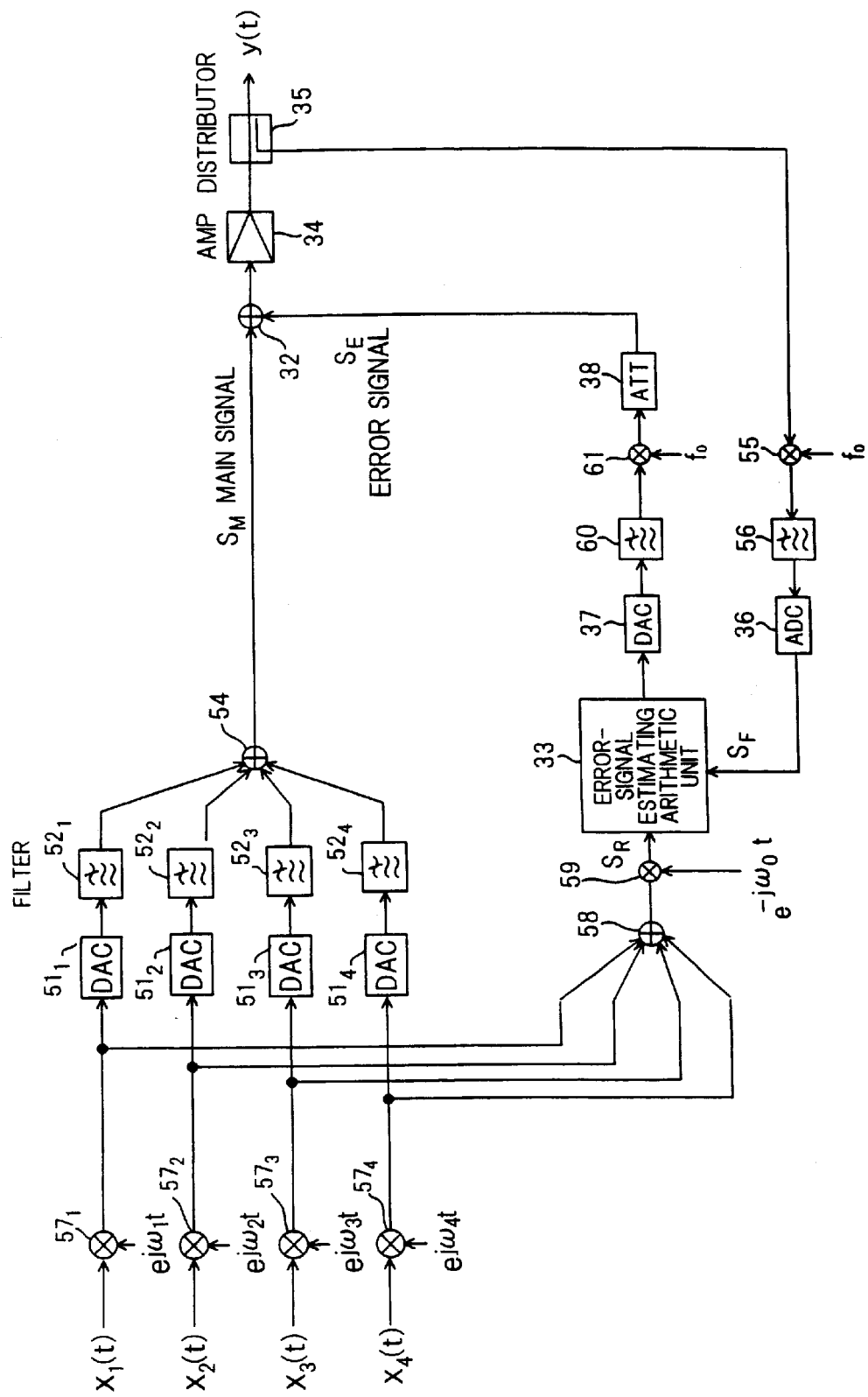
FIG. 25 shows a radio apparatus according to a 14th embodiment of the present invention.

FIG. 25 is a diagram showing the structure of a radio apparatus according to a 14th embodiment of the present invention. This illustrates an example of a case where four frequencies are multiplexed. Components identical with those of the sixth embodiment of FIG. 13 are designated by like reference characters. This embodiment differs from the sixth embodiment in that frequency shift processing is applied digitally to the transmit baseband signals $x_1(t)$, $x_2(t)$, $X_3(t)$, $x_4(t)$ and the signals obtained are DA-converted and combined to thereby generate an analog frequency-multiplexed signal.

The transmit baseband signals $x_1(t)$, $x_2(t)$, $X_3(t)$, $x_4(t)$ are subjected to a frequency shift by being multiplied by $\exp(j\omega_1 t)$, $\exp(j\omega_2 t)$, $\exp(j\omega_3 t)$, $\exp(j\omega_4 t)$ ($\omega_n = 2\pi f_n$) decided by a desired carrier frequency spacing, after which the shifted signals are converted to analog signals by DA converters $51_1$~$51_4$ and the combiner 54 combines the outputs of these DA converters to generate an analog frequency-multiplexed signal.

The combiner 32 combines the frequency-multiplexed signal (main signal) $S_M$ with the error signal $S_E$ output from the error-signal estimating arithmetic unit 33 and inputs the combined signal to the power amplifier (amp) 34. The distributor 35 branches part of the amplifier output and the frequency converter 55 multiplies the amplifier output signal by the local signal of frequency $f_0$ to down-convert the frequency and input the resulting signal to the AD converter 36 via the filter 56. The AD converter 36 AD-converts the input signal and inputs the obtained digital signal to the error-signal estimating arithmetic unit 33 as the feedback signal $S_F$.

Meanwhile, the combiner 58 generates the digital frequency-multiplexed signal by combining the transmit signals $x_1(t) \cdot \exp(j\omega_1 t)$, $x_2(t) \cdot \exp(j\omega_2 t)$, $x_3(t) \cdot \exp(j\omega_3 t)$, $x_4(t) \cdot \exp(j\omega_4 t)$ output from the digital frequency shifters $57_1$~$57_4$. This digital frequency-multiplexed signal is a signal equivalent to the above-mentioned analog frequency-multiplexed signal. The frequency shifter 59 subsequently multiplies the digital frequency-multiplexed signal by exp($-j\omega_0 t$) to down-convert the frequency and input the resulting signal to the error-signal estimating arithmetic unit 33 as the reference signal $S_R$.

The error-signal estimating arithmetic unit 33 uses the reference signal $S_R$ and the feedback signal $S_F$ to calculate an error signal ascribable to non-linear distortion of the amplifier. The DA converter 37 DA-converts the obtained error signal and inputs the analog signal to the frequency converter 61 via the filter 60. The frequency converter 61 multiplies the error signal by the signal of frequency $f_0$ to thereby up-convert the error signal frequency. The attenuator 38 adjusts the level of the error signal and then the combiner 32 combines the level-adjusted error signal and the main signal. As a result, there is obtained a frequency-multiplexed signal that is the result of adding on a characteristic that is the inverse of the non-linear distortion of the amplifier.

(P) 15$^{th}$ Embodiment

Figure 26:
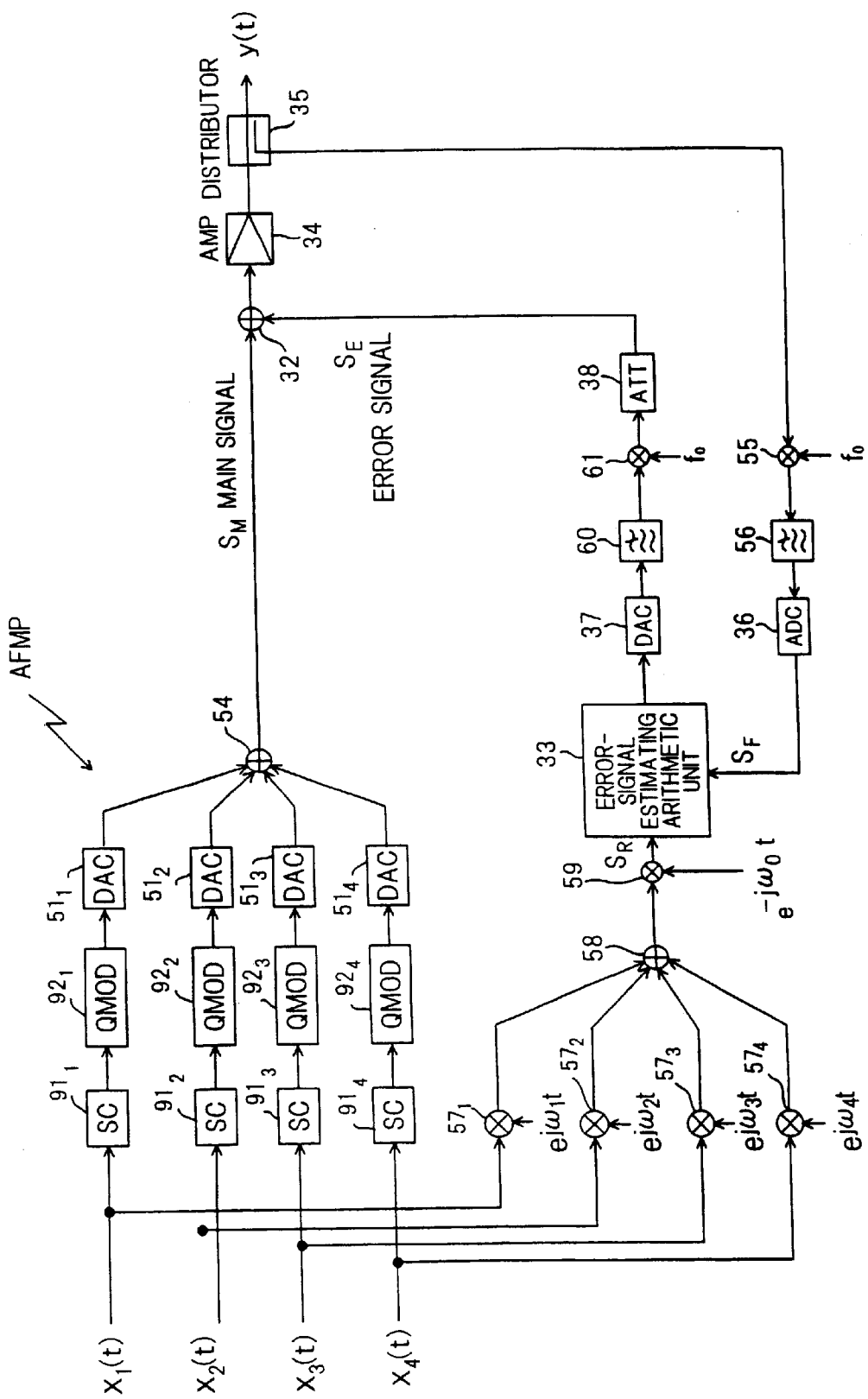
FIG. 26 shows a radio apparatus according to a 15th embodiment of the present invention.

FIG. 26 is a diagram showing the structure of a radio apparatus according to a 15$^{th}$ embodiment of the present invention. This illustrates an example of a case where four frequencies are multiplexed. Components identical with those of the sixth embodiment of FIG. 13 are designated by like reference characters. This embodiment differs from the sixth embodiment in that an analog frequency multiplexer AFMP is constituted by sampling converters $91_1$~$91_4$, digital modulator $92_1$~$92_4$, DA converters $51_1$~$51_4$ and combiner 54 for combining the outputs of these DA converters.

The sampling converters $91_1$~$91_4$ convert the rates of the transmit baseband signals $x_1(t)$, $x_2(t)$, $x_3(t)$, $x_4(t)$ to a sampling rate decided by carrier frequency. More specifically, the conversion is made to a rate that is four times that of the IF carrier frequency output. After the rate conversion is carried out, the digital quadrature modulators $92_1$~$92_4$ digitally modulate the rate-converted signals on a per-carrier basis and input the modulated signals to the DA converters $51_1$~$51_4$. The latter DA-convert the modulated signals to analog signals and the combiner 54 combines the outputs of the DA converters to generate the analog frequency-multiplexed signal (main signal) $S_M$.

The combiner 32 combines the frequency-multiplexed signal (main signal) with an error signal generated by means, described below, and inputs the combined signal to the amplifier 34. The distributor 35 branches part of the output of amplifier 34 and the frequency converter 55 multiplies the amplifier output signal by the local signal of frequency $f_0$ to down-convert the frequency and input the resulting signal to the AD converter 36 via the filter 56. The AD converter 36 AD-converts the input signal and inputs the obtained digital signal to the error-signal estimating arithmetic unit 33 as the feedback signal $S_F$.

Meanwhile, the combiner 58 generates the digital frequency-multiplexed signal by combining the transmit signals $x_1(t) \cdot \exp(j\omega_1 t)$, $x_2(t) \cdot \exp(j\omega_2 t)$, $x_3(t) \cdot \exp(j\omega_3 t)$, $x_4(t) \cdot \exp(j\omega_4 t)$ output from the digital frequency shifters $57_1$~$57_4$. This digital frequency-multiplexed signal is a signal equivalent to the above-mentioned analog frequency-multiplexed signal $S_M$. The frequency shifter 59 subsequently multiplies the digital frequency-multiplexed signal by exp($-j\omega_0 t$) to down-convert the frequency and input the resulting signal to the error-signal estimating arithmetic unit 33 as the reference signal $S_R$.

The error-signal estimating arithmetic unit 33 uses the reference signal $S_R$ and the feedback signal $S_F$ to calculate an error signal ascribable to non-linear distortion of the amplifier. The DA converter 37 DA-converts the obtained error signal and inputs the analog signal to the frequency converter 61 via the filter 60. The frequency converter 61 multiplies the error signal by the signal of frequency $f_0$ to thereby up-convert the error signal frequency. The attenuator 38 adjusts the level of the error signal and then the combiner 32 combines the level-adjusted error signal and the main signal. As a result, there is obtained a frequency-multiplexed signal that is the result of adding on a characteristic that is the inverse of the non-linear distortion of the amplifier.

Figure 27:
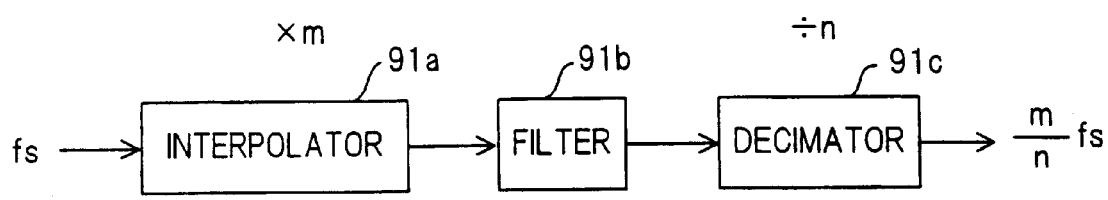
FIG. 27 is a diagram showing the principles of a sampling-rate converter.

FIG. 27 is a diagram showing the principles of a sampling-rate converter. A sampling-rate converter for converting the information rate of a digital signal to a rate multiplied by m/n is constituted by an interpolator 91a for inserting (m-1)-number of "0" between input sample signals, a filter 91b for dealiasing and a decimator 91c for extracting values of the necessary sample timing from the filter-output sample sequence every other n. By virtue of such an m/n sampling rate converter, a baseband signal x(t) generated at a sampling rate that is the chip rate or a whole-number multiple of the chip rate is converted to a signal having a sampling rate decided by the carrier spacing.

Figure 28:
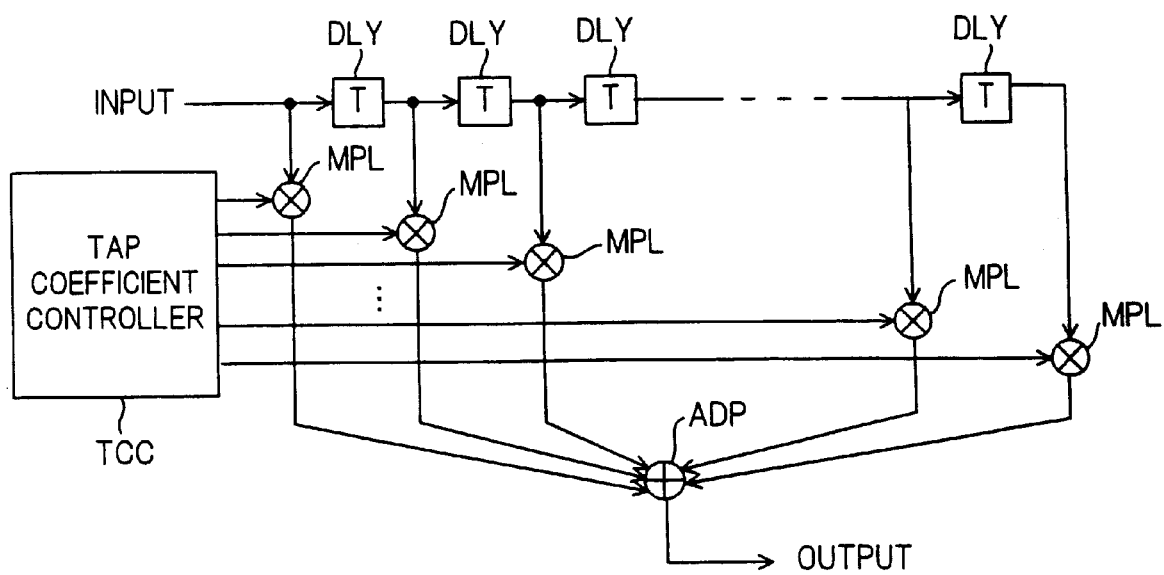
FIG. 28 is a diagram showing the principles of a sampling-rate converter.
Figure 29:
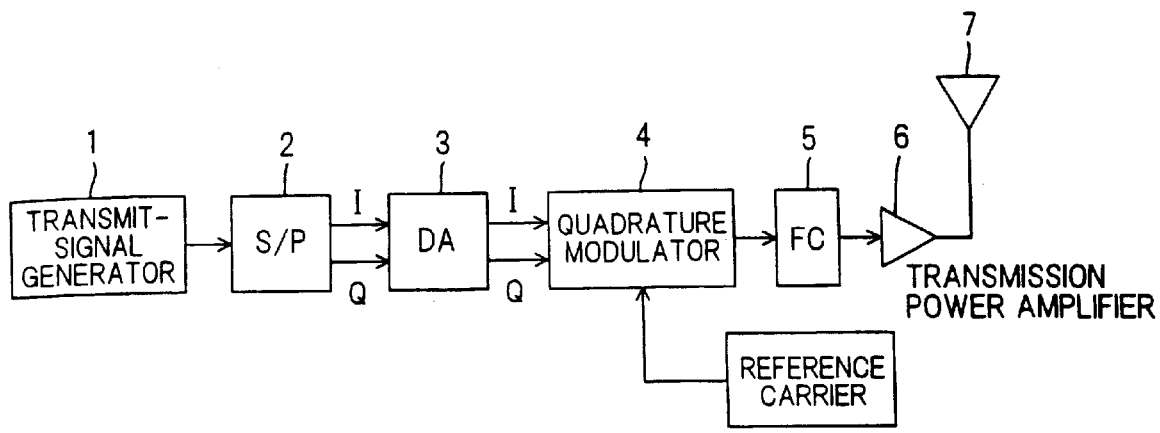
FIG. 29 is a diagram showing the structure of a transmitting apparatus according to the prior art.
Figure 30:
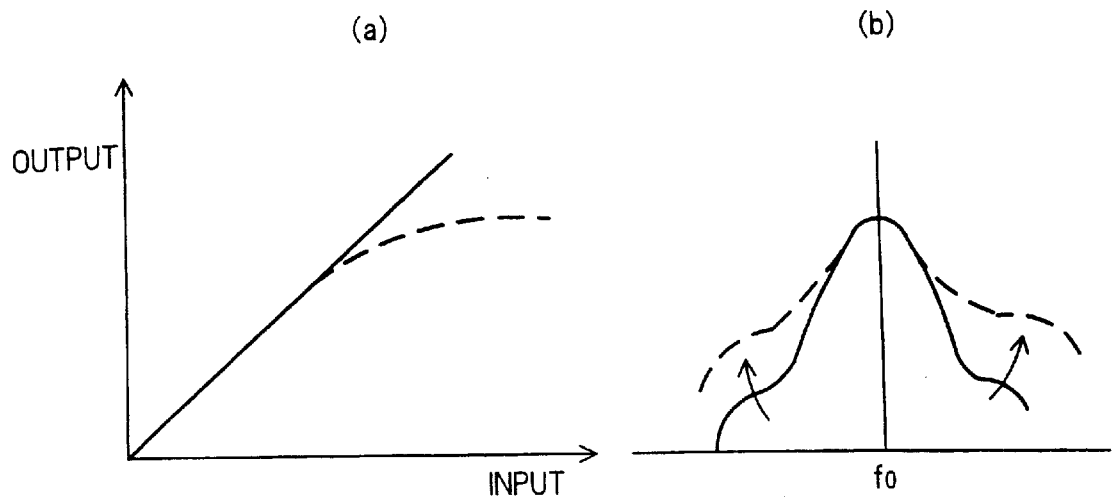
FIG. 30 is a diagram useful in describing problems ascribable to non-linearity of a transmission power amplifier.
Figure 31:
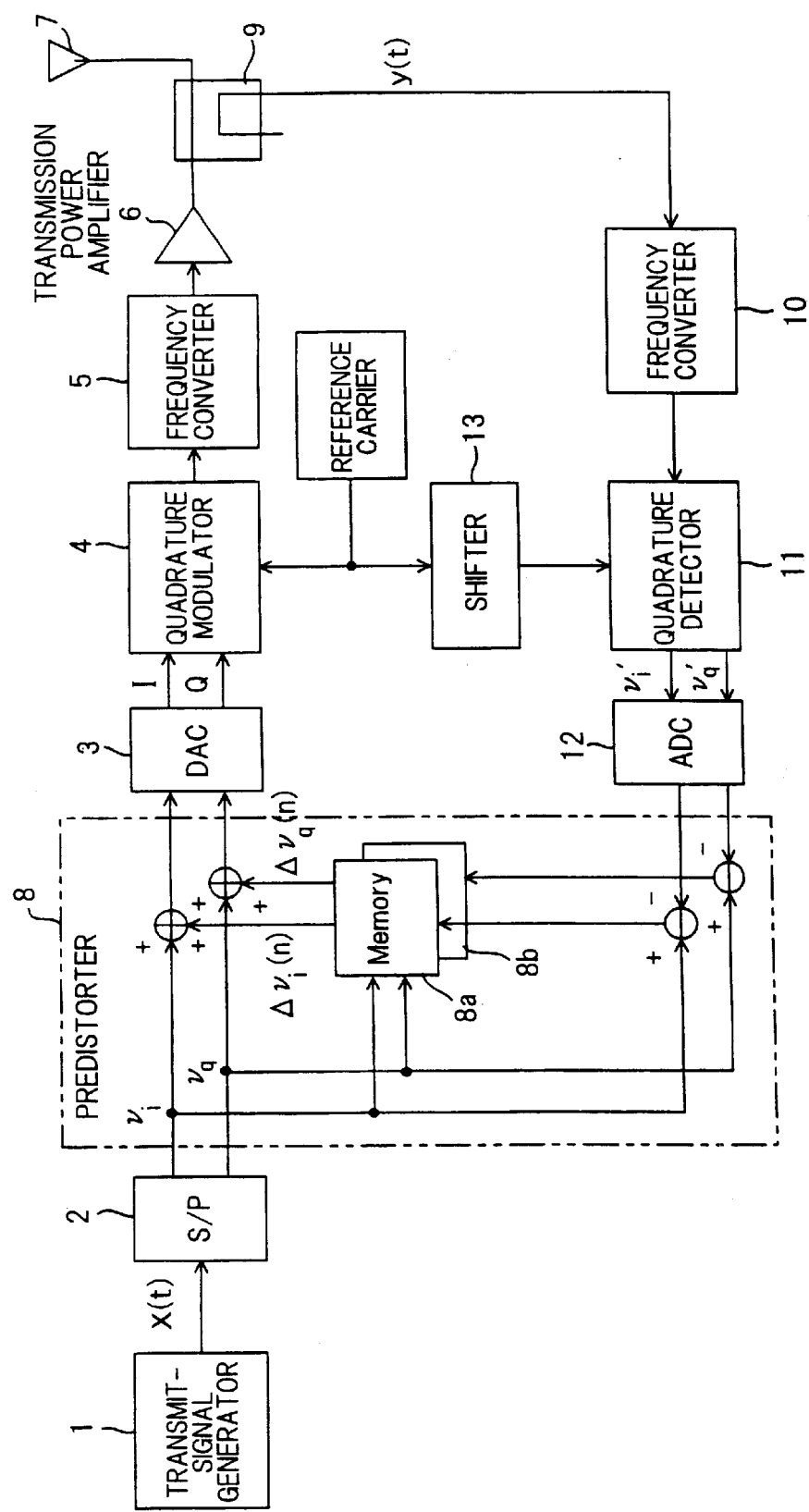
FIG. 31 shows the structure (Cartesian scheme) of a transmitting apparatus having a digital non-linear distortion compensating function according to the prior art.
Figure 32:
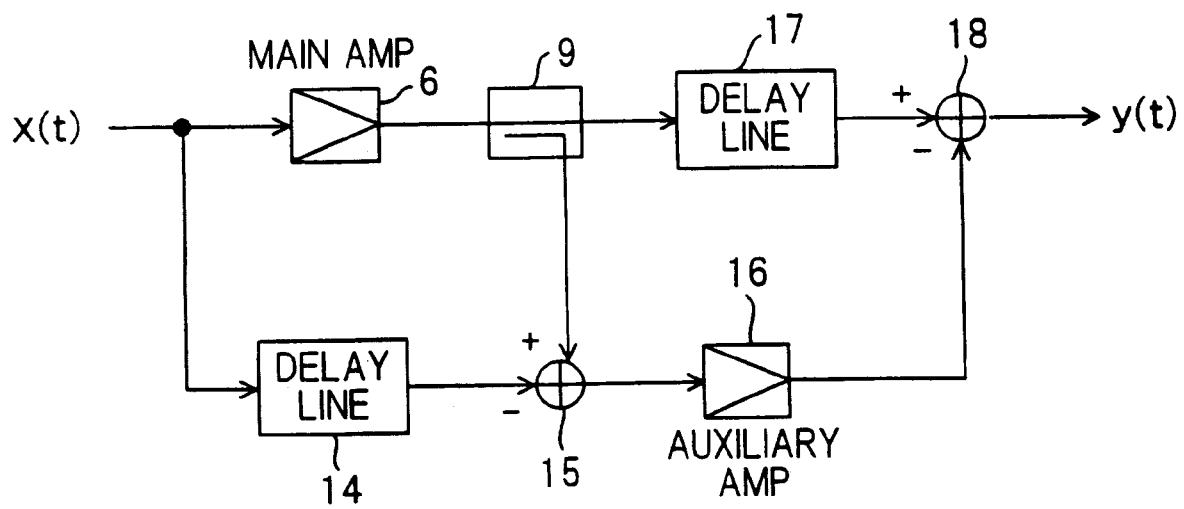
FIG. 32 is a diagram showing the structure of a prior-art example of a feed-forward system.

FIG. 28 shows an embodiment of the sampling-rate converter. The sampling-rate converter is implemented by a FIR filter that changes over the weighting coefficients of filter taps. The FIR filter has a plurality of delay units DLY, a plurality of coefficient multipliers MPL, an adder ADD and a tap controller TCC for changing over the tap coefficients. The operation performed by the FIR filter is indicated by the following equation:

$$y(i) = \sum_{k=-Ntap/2}^{Ntap/2-1} h[mk + (ni)_m] x\left(\left[\frac{ni}{m}\right] - k\right) \quad (4)$$

$(n)_m$ = n modulo m

[a]: largest integer that does not exceed a

Here x(i) represents a discrete time signal at the filter input, y(i) a discrete time signal at the filter output, and h(k) an impulse response of the dealiasing filter designed based upon over sampling by a factor of m and tap length $N_{tap}$. For example, with regard to a case where m=4, n=3, $N_{tap}$=8 hold, control for changing over the tap coefficients h(k) in the arrangement of FIG. 28 is as indicated below. Tap coefficients h(k) are obtained by changing over 32 (=m×N taps) of h(-16) to h(15) in accordance with the result of Equation (2).

time i=0: h(-16) h(-12) h(-8) h(-4) h(0) h(4) h(8) h(12)
time i=1: h(-13) h(-9) h(-5) h(-1) h(3) h(7) h(11) h(15)
time i=2: h(-14) h(-10) h(-6) h(-2) h(2) h(6) h(10)h(14)
time i=3: h(-15) h(-11) h(-7) h(-3) h(1) h(5) h(9) h(13)
time i=4: h(-16) h(-12) h(-8) h(-4) h(0) h(4) h(8) h(12)
time i=5: h(-13) h(-9) h(-5) h(-1) h(3) h(7) h(11) h(15)

Conversion to a sampling rate that is multiplied by 4/3 can be implemented by a FIR filter using these tap coefficients and weighting coefficient.

Thus, in accordance with the present invention, it is possible to lower the bit precision of DA converters and the conversion speed of AD converters used in compensating for non-linear distortion of a signal having a wide band and a large dynamic range.

Further, in accordance with the present invention, a predistorter for a W-CDMA multicarrier signal that has been difficult to realize until now can be implemented with the device capabilities of currently existing D/A and A/D converters.

Further, in accordance with the present invention, an auxiliary amplifier, delay lines and coupler, etc., that were essential for conventional feed-forward distortion compensation schemes are no longer required. This makes it possible to improve the overall efficiency of a power amplifier.

What is claimed is:

1. A radio apparatus for compensating for non-linear distortion of a transmission power amplifier, characterized by having:
    a first DA converter for converting a transmit signal to an analog signal and outputting the analog transmit signal;
    a transmission power amplifier for amplifying and transmitting the transmit signal;
    branching means for branching part of an output signal of said transmission power amplifier;
    an AD converter for converting, to a digital signal, the output signal of the transmission power amplifier branched by the branching means or a signal obtained by subjecting this output signal to predetermined processing, and outputting the digital signal as a feedback signal;
    an error estimating arithmetic unit for estimating and outputting an error signal, which is ascribable to non-linear distortion of the amplifier, using the feedback signal and a reference signal, which is the transmit signal;
    a second DA converter for converting said error signal to an analog signal and outputting the analog signal; and
    a combiner for combining, and outputting to the transmission power amplifier, the transmit signal converted to the analog signal by the first DA converter and the error signal converted to the analog signal by the second DA converter.

2. A radio apparatus for compensating for non-linear distortion of a transmission power amplifier which amplifies and transmits a multicarrier signal for carrying multiple transmit signals, characterized by having:
    a first DA converter for converting each digital transmit signal to an analog transmit baseband signal and outputting the analog baseband signal;
    an analog frequency multiplexer for subjecting each transmit baseband signal to a frequency-shift operation decided by carrier spacing and frequency-multiplexing the frequency-shifted signals;
    a transmission power amplifier for amplifying and transmitting the frequency-multiplexed signal;
    branching means for branching part of an output signal of said transmission power amplifier;
    an AD converter for converting, to a digital signal, the output signal of the transmission power amplifier branched by the branching means or a signal obtained by subjecting this output signal to predetermined processing, and outputting the digital signal as a feedback signal;
    a digital frequency multiplexer for subjecting each digital transmit signal digitally to a frequency-shift operation decided by carrier spacing, frequency-multiplexing the frequency-shifted signals and outputting the frequency-multiplexed signal as a reference signal;
    an error estimating arithmetic unit for estimating and outputting an error signal, which is ascribable to non-linear distortion of the amplifier, using the reference signal and the feedback signal;
    a second DA converter for converting said error signal to an analog signal and outputting the analog signal; and
    a combiner for combining, and outputting to the transmission power amplifier, the error signal converted to the analog signal by said DA converter and an output signal of said analog frequency multiplexer.

3. A radio apparatus according to claim 1, characterized in that said error estimating arithmetic unit obtains error signals by a digital Cartesian scheme in such a manner that a difference between said reference signal and said feedback signal becomes zero, stores said error signals in a memory in correspondence with transmit-signal values, reads an error signal that corresponds to a present transmit signal out of the memory and outputs the error signal.

4. A radio apparatus according to claim 1, characterized in that said error estimating arithmetic unit transforms said reference signal and said feedback signal from a rectangular coordinate system to a polar coordinate system, obtains error signals in such a manner that a difference between said reference signal and said feedback signal becomes zero in the polar coordinate system, stores the error signals in memory in correspondence with transmit-signal values, reads an error signal that corresponds to a present transmit signal out of the memory, transforms said error signal from the polar coordinate system to the rectangular coordinate system and outputs the error signal.

5. A radio apparatus according to claim 1, characterized in that said error estimating arithmetic unit obtains distortion compensation coefficients by adaptive signal processing using said reference signal and said feedback signal, stores said distortion compensation coefficients in a memory in correspondence with transmit-signal power values, reads a distortion compensation coefficient corresponding to a power value of a present transmit signal out of the memory, multiplies said transmit value by the distortion compensation coefficient and outputs, as an error signal, a difference between a transmit signal before multiplication by said distortion compensation coefficient and the transmit signal after multiplication by the distortion compensation coefficient.

6. A radio apparatus according to claim 1, characterized in that said error estimating arithmetic unit obtains, and store in a memory, distortion compensation coefficients by adaptive signal processing using said reference signal and said feedback signal, reads a distortion compensation coefficient corresponding to a present transmission power value and a past transmit-signal value out of the memory, multiplies the present transmit value by the distortion compensation coefficient and outputs, as an error signal, a difference between a transmit signal before multiplication by said distortion compensation coefficient and the transmit signal after multiplication by the distortion compensation coefficient.

7. A radio apparatus according to claim 1, characterized by further having:
    means for converting a transmit signal to a quadrature signal having an in-phase component and a quadrature component;
    DA converters, which construct said first DA converter, for converting the signal components of the quadrature signal to respective ones of analog signals;
    a first quadrature modulator, to which the analog signal components output from respective ones of the DA converters are input, for subjecting the transmit signal to quadrature modulation;
    a quadrature demodulator for subjecting an output signal of the transmission power amplifier to quadrature demodulation processing;

AD converters, which construct said AD converter, for converting an in-phase component and a quadrature component of a quadrature-demodulated signal output from the quadrature modulator to respective ones of digital signals;

DA converters, which construct said second DA converter, for converting an in-phase component and a quadrature component of an error signal output from said error-signal estimating arithmetic unit to respective ones of analog signals; and a second quadrature modulator, to which the analog signal components output from respective ones of the DA converters are input, for subjecting the error signal to quadrature modulation;

said error-signal estimating arithmetic unit outputting an error signal in such a manner that a difference between the in-phase components and a difference between the quadrature components of the quadrature signal before distortion compensation and the quadrature demodulated signal will become zero, and said combiner combines output signals of the first and second quadrature modulators and inputs the combined signal to the transmission power amplifier.

8. A radio apparatus according to claim 7, characterized by further having sample-and-hold circuits provided on an input side of respective ones of the AD converters;

sampling rate of AD conversion and sampling band being set independently.

9. A radio apparatus according to claim 1, characterized by further having:

means for converting a transmit signal to a quadrature signal having an in-phase component and a quadrature component;

a first digital quadrature modulator, to which the input signal components are input, for subjecting the transmit signal to quadrature modulation and inputting the resulting signal to said first DA converter;

a digital quadrature demodulator for subjecting an output signal of said AD converter to quadrature demodulation processing; and a second digital quadrature modulator, to which an in-phase component and a quadrature component of an error signal output from said error-signal estimating arithmetic unit are input, for subjecting said error signal to quadrature modulation and inputting the resulting signal to said second DA converter;

said error-signal estimating arithmetic unit outputting an error signal in such a manner that a difference between the in-phase components and a difference between the quadrature components of the quadrature signal before distortion compensation and the quadrature demodulated signal will become zero.

10. A radio apparatus according to claim 9, characterized by further having a sample-and-hold circuit provided on an input side of the AD converter;

sampling rate of AD conversion and sampling band being set independently.

11. A radio apparatus according to claim 2, characterized by further having:

means for converting respective ones of transmit signals to quadrature signals each having an in-phase component and a quadrature component;

DA converters, which construct each of said first DA converters, for converting an in-phase component and a quadrature component of a respective quadrature signal to respective ones of analog signals;

a first quadrature modulator, for each quadrature signal, to which the analog in-phase and quadrature components output from corresponding DA converters are input, for subjecting the transmit signal to quadrature modulation;

a quadrature demodulator for subjecting an output signal of the transmission power amplifier, or a signal obtained by subjecting said output signal to predetermined processing, to quadrature demodulation processing;

AD converters, which construct said AD converter, for converting an in-phase component and a quadrature component of the quadrature demodulated signal output from the quadrature demodulator to respective ones of digital signals;

DA converters, which construct said second DA converter, for converting an in-phase component and a quadrature component of an error signal output from said error-signal estimating arithmetic unit to respective ones of analog signals; and a second quadrature modulator, to which the signal components of the error signal output from said DA converters are input, for subjecting the error signal to quadrature modulation;

said error-signal estimating arithmetic unit outputting an error signal in such a manner that a difference between the in-phase components and a difference between the quadrature components of the quadrature signal before distortion compensation and the quadrature demodulated signal will become zero, and said combiner combines output signals of the first and second quadrature modulators and inputs the combined signal to the transmission power amplifier.

12. A radio apparatus according to claim 11, characterized by further having sample-and-hold circuits provided on an input side of respective ones of the AD converters;

sampling rate of AD conversion and sampling band being set independently.

13. A radio apparatus according to claim 2, characterized by further having:

means for converting respective ones of transmit signals to quadrature signals each having an in-phase component and a quadrature component;

a first digital quadrature modulator, for every quadrature signal, to which digital in-phase and quadrature components are input, for subjecting the transmit signal to quadrature modulation and inputting the resulting signal to said first DA converter;

a digital quadrature demodulator for subjecting an output signal of said AD converter to quadrature demodulation processing; and a second digital quadrature modulator, to which an in-phase component and a quadrature component of an error signal output from said error-signal estimating arithmetic unit are input, for subjecting said error signal to quadrature modulation and inputting the resulting signal to said second DA converter;

said error-signal estimating arithmetic unit outputting an error signal in such a manner that a difference between the in-phase components and a difference between the quadrature components of the quadrature signal before distortion compensation and the quadrature demodulated signal will become zero.

14. A radio apparatus according to claim 9, characterized by further having a sample-and-hold circuit provided on an input side of said AD converter;

sampling rate of AD conversion and sampling band being set independently.

15. A radio apparatus according to 2, characterized by further having a correction circuit for every transmit signal, said correction circuit having an AD converter for converting, to a digital signal, an analog signal obtained by a frequency shift performed by said analog frequency multiplexer, and means for comparing an output of this AD converter with a signal obtained by digitally subjecting said transmit signal to the frequency-shift operation, and correcting amplitude and phase of the output signal based upon result of the comparison;

said digital frequency multiplexer combining output signals of respective ones of the correction circuits and outputting the combined signal as the reference signal.

16. A radio apparatus according to claim 11, characterized by further having a correction circuit for every transmit signal, said correction circuit having a quadrature demodulator for subjecting an analog signal, which is obtained by a frequency shift performed by said analog frequency multiplexer, to quadrature demodulation processing, AD converters for converting, to respective ones of digital signals, an in-phase component and a quadrature component of a quadrature-demodulated signal from the quadrature demodulator, and means for comparing outputs of these AD converters with signals obtained by digitally subjecting said transmit signal to the frequency-shift operation, and correcting amplitude and phase of the output signal based upon result of the comparison;

said digital frequency multiplexer combining output signals of respective ones of the correction circuits and outputting the combined signal as the reference signal.

17. A radio apparatus according to 13, characterized by further having a correction circuit for every transmit signal, said correction circuit having an AD converter for converting, to a digital signal, an analog signal obtained by a frequency shift performed by said analog frequency multiplexer, a digital quadrature demodulator for subjecting an output signal of this AD converter to quadrature demodulation processing, and means for comparing the quadrature-demodulated signal with a signal obtained by digitally subjecting said transmit signal to the frequency-shift operation, and correcting amplitude and phase of the output signal based upon result of the comparison;

said digital frequency multiplexer combining output signals of respective ones of the correction circuits and outputting the combined signal as the reference signal.

18. A radio apparatus according to claim 2, characterized by further having PLL circuits, to which are input digital frequency signals used to subject the transmit signals to the frequency-shift operation in the digital frequency multiplexer, for generating carrier frequency signals used in the frequency shift of said analog frequency multiplexer.

19. A radio apparatus according to claim 2, characterized by further having DA converters for DA-converting digital frequency signals used to subject the transmit signals to the frequency-shift operation in the digital frequency multiplexer, and adopting the analog frequency signals, which are obtained by the DA conversion, as carrier frequency signals used in the frequency shift of said analog frequency multiplexer.

20. A radio apparatus for compensating for non-linear distortion of a transmission power amplifier which amplifies and transmits a multicarrier signal for carrying multiple transmit signals, characterized by having:

a frequency shifter for subjecting each digital transmit signal digitally to a frequency-shift operation decided by carrier spacing;

a DA converter for DA-converting each frequency-shifted transmit signal;

an analog frequency multiplexer for frequency-multiplexing outputs of each of the DA converters;

a transmission power amplifier for amplifying and transmitting a transmit signal;

branching means for branching part of an output signal of said transmission power amplifier;

an AD converter for converting, to a digital signal, the output signal of the transmission power amplifier branched by said branching means or a signal obtained by subjecting this output signal to predetermined processing, and outputting the digital signal as a feedback signal;

a digital frequency multiplexer for digitally combining the frequency-shifted transmit signals and outputting a reference signal;

an error estimating arithmetic unit for estimating and outputting an error signal, which is ascribable to non-linear distortion of the amplifier, using the reference signal and said feedback signal;

a DA converter for converting said error signal to an analog signal and outputting the analog signal; and a combiner for combining, and outputting to the transmission power amplifier, the error signal converted to the analog signal by said DA converter and an output signal of said analog frequency multiplexer.

21. A radio apparatus for compensating for non-linear distortion of a transmission power amplifier which amplifies and transmits a multicarrier signal for carrying multiple transmit signals, characterized by having:

a sampling-rate converter for converting each digital transmit signal to a digital signal having a sampling rate decided by carrier spacing;

a digital quadrature modulator for subjecting an output signal of each sampling-rate converter to quadrature modulation;

a DA converter for converting an output signal of each quadrature modulator to an analog signal;

first combining means for combining outputs of the DA converters;

a transmission power amplifier for amplifying and transmitting a transmit signal;

branching means for branching part of an output signal of said transmission power amplifier;

an AD converter for converting, to a digital signal, the output signal of the transmission power amplifier branched by said branching means or a signal obtained by subjecting this output signal to predetermined processing, and outputting the digital signal as a feedback signal;

a digital frequency multiplexer for performing frequency multiplexing by digitally subjecting each digital transmit signal to a frequency-shift operation decided by carrier spacing, and outputting a reference signal;

an error estimating arithmetic unit for estimating and outputting an error signal, which is ascribable to non-linear distortion of the amplifier, using the reference signal and said feedback signal;

a DA converter for converting said error signal to an analog signal and outputting the analog signal; and a second combiner for combining, and outputting to the transmission power amplifier, the error signal converted to the analog signal by said DA converter and an output signal of said first combiner.

* * * * *